United States Patent
Nomiya et al.

(10) Patent No.: US 8,371,026 B2
(45) Date of Patent: Feb. 12, 2013

(54) METHOD FOR MANUFACTURING MULTILAYER CERAMIC ELECTRONIC DEVICE

(75) Inventors: Masato Nomiya, Moriyama (JP); Norio Sakai, Moriyama (JP); Mitsuyoshi Nishide, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 1059 days.

(21) Appl. No.: 12/267,705

(22) Filed: Nov. 10, 2008

(65) Prior Publication Data

US 2009/0056987 A1 Mar. 5, 2009

Related U.S. Application Data

(63) Continuation of application No. PCT/JP2007/060523, filed on May 23, 2007.

(30) Foreign Application Priority Data

Jun. 2, 2006 (JP) ................................ 2006-155401

(51) Int. Cl.
H05K 3/30 (2006.01)
H05K 1/03 (2006.01)

(52) U.S. Cl. .............................. 29/832; 29/841; 174/255

(58) Field of Classification Search .................... 29/832, 29/825, 829, 841, 846; 174/255, 258, 260–261, 174/264; 257/684; 361/762; 428/210
See application file for complete search history.

(56) References Cited

U.S. PATENT DOCUMENTS

| | | | | |
|---|---|---|---|---|
| 4,943,468 A * | 7/1990 | Gordon et al. | ................. | 428/210 |
| 5,483,421 A * | 1/1996 | Gedney et al. | ................. | 361/771 |
| 5,574,630 A * | 11/1996 | Kresge et al. | ................. | 361/792 |
| 5,834,848 A * | 11/1998 | Iwasaki | ......................... | 257/778 |
| 5,952,709 A * | 9/1999 | Kitazawa et al. | ............. | 257/664 |
| 6,002,177 A * | 12/1999 | Gaynes et al. | ................. | 257/774 |
| 6,201,307 B1 * | 3/2001 | Terashi et al. | ................. | 257/784 |
| 6,207,550 B1 * | 3/2001 | Hase et al. | ..................... | 438/613 |

(Continued)

FOREIGN PATENT DOCUMENTS

| | | |
|---|---|---|
| JP | 4-99834 U | 8/1992 |
| JP | 6-204272 A | 7/1994 |

(Continued)

OTHER PUBLICATIONS

Official Communication issued in corresponding European Patent Application No. 07743957.8, mailed on Feb. 22, 2011.

(Continued)

*Primary Examiner* — David Angwin
(74) *Attorney, Agent, or Firm* — Keating & Bennett, LLP

(57) ABSTRACT

In a method for manufacturing a multilayer ceramic electronic device, a multilayer ceramic element assembly is prepared that includes laminated unsintered ceramic base material layers, a first conductor pattern, a seat portion disposed in a surface of the multilayer ceramic element assembly and arranged to mount a surface mount electronic device thereon, a second conductor pattern connected to the surface mount electronic device, and a resin introduction portion located outside a vertically projected region of the surface mount electronic device and arranged to introduce a resin to the seat portion. The multilayer ceramic element assembly is fired and the surface mount electronic device is mounted on the seat portion of the fired multilayer ceramic element assembly with the second conductor pattern therebetween. The resin is filled from the resin introduction portion into the seat portion and between the seat portion and the surface mount electronic device, and the resin is cured.

13 Claims, 15 Drawing Sheets

U.S. PATENT DOCUMENTS

| | | | |
|---|---|---|---|
| 6,232,251 B1 * | 5/2001 | Terashi et al. | 501/5 |
| 6,317,331 B1 * | 11/2001 | Kamath et al. | 361/760 |
| 6,351,393 B1 * | 2/2002 | Kresge et al. | 361/795 |
| 6,362,437 B1 * | 3/2002 | Arai | 174/260 |
| 6,373,717 B1 * | 4/2002 | Downes et al. | 361/795 |
| 6,486,415 B2 * | 11/2002 | Jimarez et al. | 174/263 |
| 6,528,145 B1 * | 3/2003 | Berger et al. | 428/156 |
| 6,734,540 B2 * | 5/2004 | Fritz | 257/686 |
| 6,953,756 B2 * | 10/2005 | Kawai et al. | 501/9 |
| 7,226,654 B2 * | 6/2007 | Kawai et al. | 428/210 |
| 7,595,997 B2 * | 9/2009 | Nomiya et al. | 361/742 |
| 2002/0069523 A1 * | 6/2002 | Arai | 29/830 |
| 2003/0211301 A1 * | 11/2003 | Flint et al. | 428/202 |
| 2003/0211302 A1 | 11/2003 | Mandai et al. | |
| 2005/0023032 A1 * | 2/2005 | Kawai et al. | 174/258 |
| 2005/0023033 A1 | 2/2005 | Saiki et al. | |

FOREIGN PATENT DOCUMENTS

| | | |
|---|---|---|
| JP | 10-189856 A | 7/1998 |
| JP | 11-145195 A | 5/1999 |
| JP | 2004-55728 A | 2/2004 |
| JP | 2005-39239 A | 2/2005 |

OTHER PUBLICATIONS

Official communication issued in counterpart International Application No. PCT/JP2007/060523, mailed on Aug. 21, 2007.

* cited by examiner

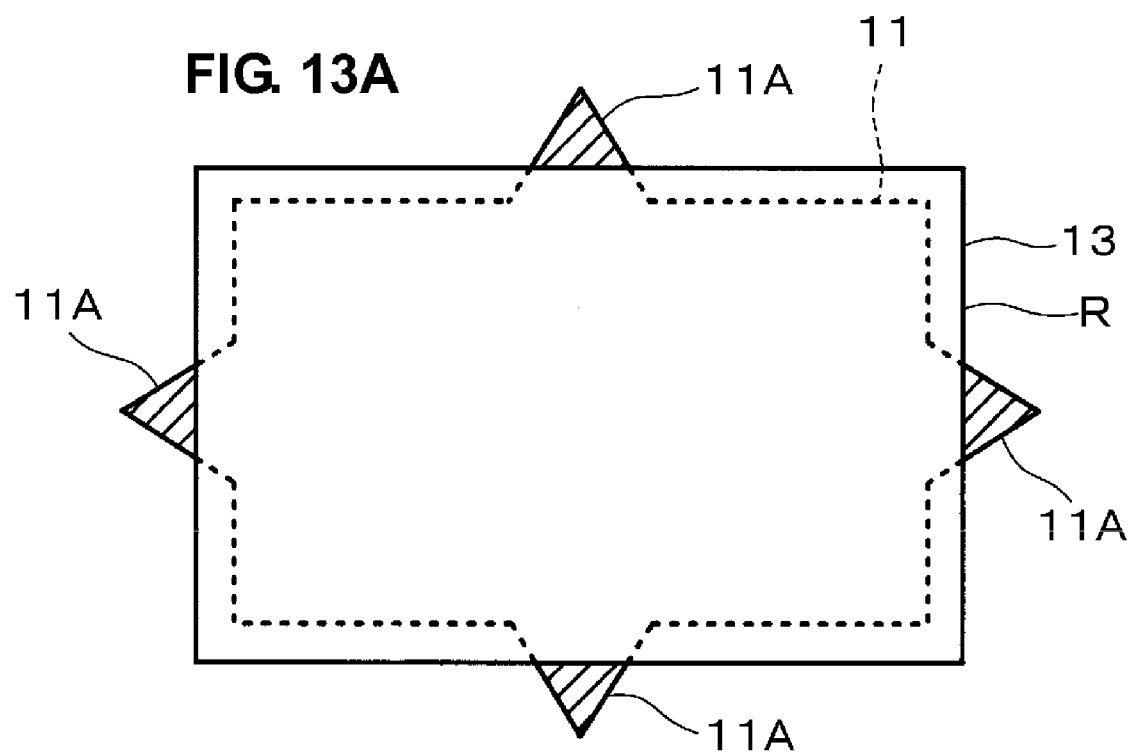
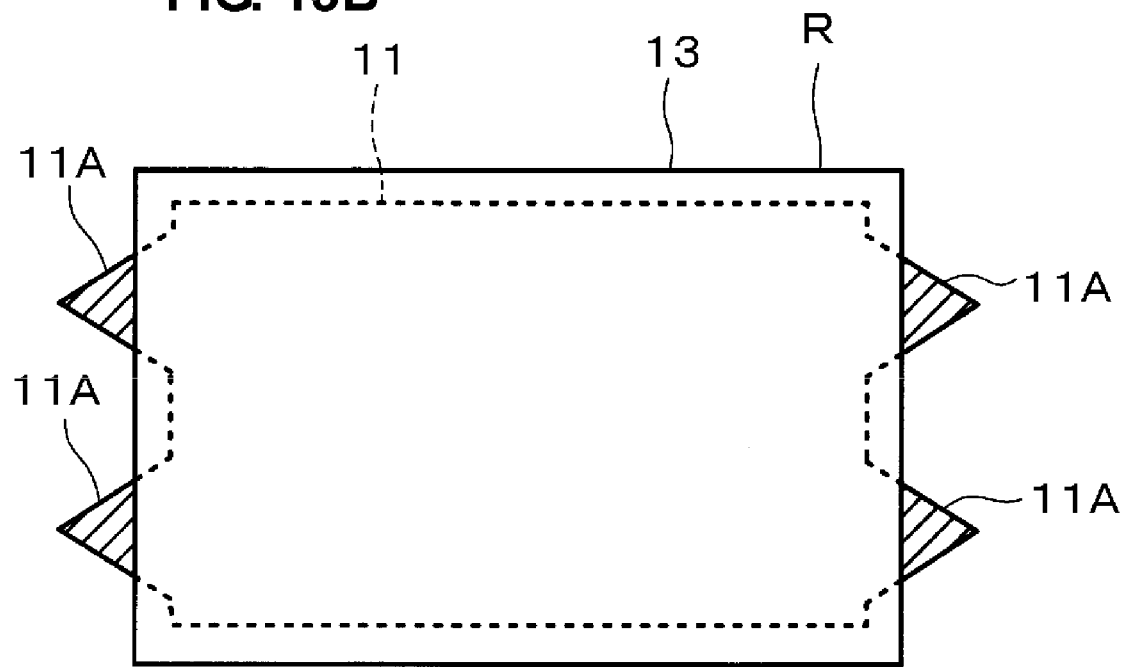

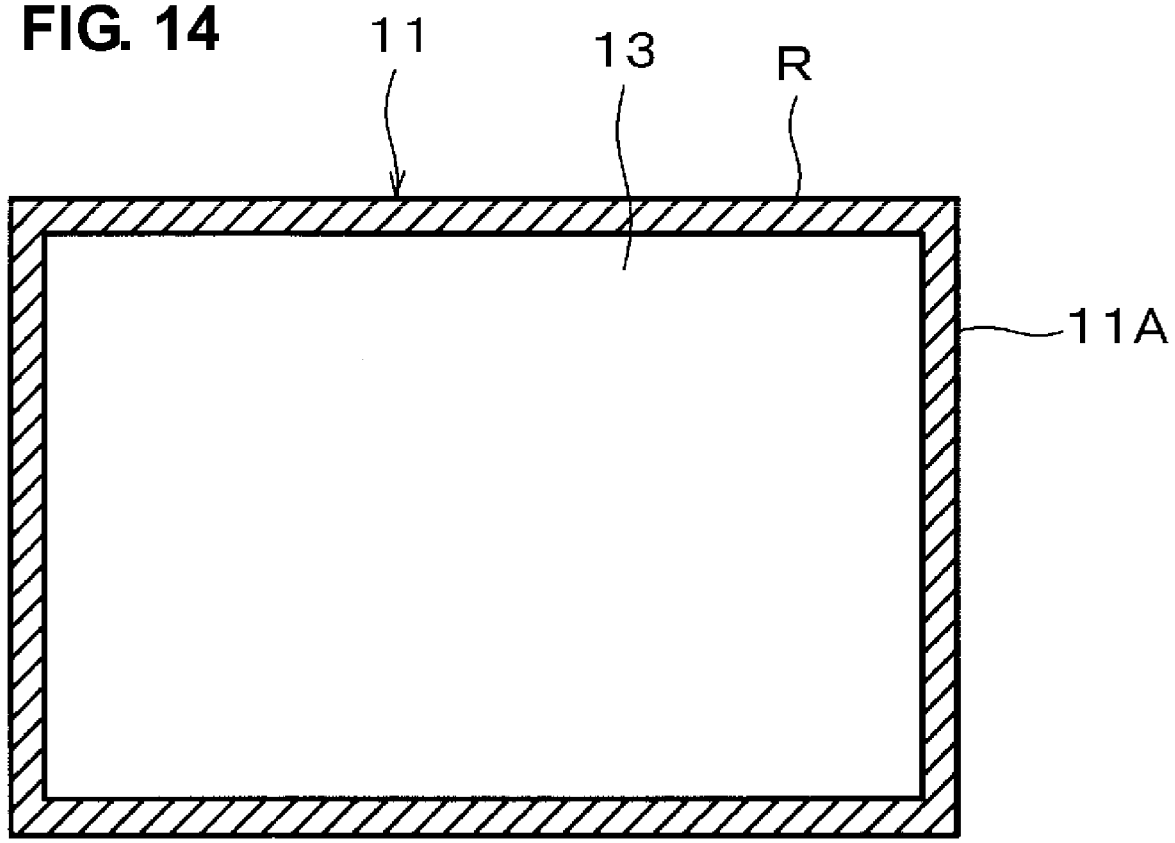

METHOD FOR MANUFACTURING MULTILAYER CERAMIC ELECTRONIC DEVICE

BACKGROUND OF THE INVENTION

1. Field of the Invention

The present invention relates to an electronic device and a method for manufacturing the same. In particular, the present invention relates to a multilayer ceramic electronic device in which a surface mount electronic device is mounted on a multilayer ceramic element assembly and a method for manufacturing the same.

2. Description of the Related Art

In recent years, performance of electronic devices in the electronics field has improved significantly and contributed to increased information processing speeds, miniaturization of apparatuses, and expansion in functionality of information processing apparatuses, e.g., large-scale computers, mobile communication terminals, and personal computers.

A multi-chip module (MCM) in which a plurality of semiconductor devices, e.g., very large scale integrations (VLSIs) and ultra large scale integrations (ULSIs), are mounted on a ceramic substrate has been used for such electronic devices. In such a module, a ceramic multilayer substrate, in which wiring conductors are three-dimensionally arranged, is commonly used to increase the packaging density of LSIs and to reliably electrically connect large scale integrations (LSIs).

This ceramic multilayer substrate is formed by laminating a plurality of ceramic layers and is provided with wiring conductors defining circuits on the surface of or inside the ceramic multilayer substrate. Regarding mobile communication terminals, such as cellular phones, automobile radio communication apparatuses, demands for high-performance, high-density mounting have increased and further miniaturization have been required. Furthermore, demands for improved impact resistance of products including ceramic multilayer substrates have been increasing.

As shown in FIG. 18, a method for mounting a semiconductor device on a substrate has been disclosed in which solder balls (bumps) 54 provided on a semiconductor element 53 are fusion-bonded to an electrically conductive pattern 52 formed on a substrate 51 using via electrodes, printed electrodes, and other suitable conductive elements, and, in addition, a thermosetting resin 55 that functions as an impact relaxation layer is filled between the substrate 51 and the semiconductor element 53, for the purpose of improving the impact resistance (see, for example, Japanese Unexamined Utility Model Registration Application Publication No. 4-99834).

The mounting method and the mounting structure improve the impact resistance of the ceramic multilayer substrate, and improve the impact resistance of products including ceramic multilayer substrates. However, when adaptation of such a mounting structure is intended, a further reduction in the area of an electrically conductive pattern, that is, a surface electrode, is necessary in order to miniaturize a product.

If the area of the surface electrode that provides the electrical conductivity is reduced, the diameter of the solder ball must be decreased, the distance between the substrate 51 and the semiconductor element 53 decreases, the thickness of the thermosetting resin (impact relaxation layer) 55 filled between the substrate 51 and the semiconductor element 53 decreases, and the impact resistance becomes insufficient with respect to a ceramic multilayer substrate provided with the mounting structure disclosed in Japanese Unexamined Utility Model Registration Application Publication No. 4-99834.

As shown in FIG. 19, a mounting structure (semiconductor apparatus) has been disclosed, in which, electrodes 62 provided on a back surface of a semiconductor element 61 are mounted on a multilayer circuit board 64 having a plurality of protruding electrodes 63 with top portions made of an electrically conductive adhesive and adjusted to be substantially flush with each other, the electrodes 62 of the semiconductor element 61 and the top portions of the protruding electrodes 63 are electrically connected, and a shrinkable insulating resin layer 65 is filled in a gap between the semiconductor element 61 and the multilayer circuit board 64 (see, for example, Japanese Unexamined Patent Application Publication No. 11-26631).

Moreover, it is believed that with the mounting structure disclosed in Japanese Unexamined Patent Application Publication No. 11-26631, the semiconductor element 61 can be mounted on the multilayer circuit board 64 with high reliability without requiring the multilayer circuit board 64 to be extremely flat.

However, there are limits to the amount that the diameter of the protruding electrode (columnar electrode) 63 can be reduced, the amount the aspect ratio, i.e. a ratio of the height to the diameter (height/diameter) of the protruding electrode (columnar electrode) 63 can be improved, and the amount the distance between adjacent protruded electrodes (columnar electrodes) 63 can be reduced. Therefore, it is difficult to satisfactorily meet the demands for protruding electrodes (columnar electrodes) 63 having smaller diameters and high aspect ratios.

Furthermore, with the mounting structure disclosed in Japanese Unexamined Patent Application Publication No. 11-26631, it is necessary to arrange the resin between the semiconductor element 61 and the multilayer circuit board 64 by injection after the semiconductor element 61 is mounted. However, the resin leaks from a lower region of the semiconductor element 61 to the surrounding region because of the viscosity of the resin and the state of leakage fluctuates. Therefore, when mounting the surface mount electronic devices other than the semiconductor element 61 on regions surrounding the semiconductor element 61, regions close to the region on which the semiconductor element 61 has been mounted cannot be effectively used as mounting spaces. Consequently, there is a problem in that high-density mounting of surface mount electronic devices is prevented.

SUMMARY OF THE INVENTION

To overcome the problems described above, preferred embodiments of the present invention provide a method for manufacturing a multilayer ceramic electronic device, wherein leakage of an underfill resin arranged to fix a surface mount electronic device does not occur and high-density, high-accuracy mounting of a device is provided, and a highly reliable multilayer ceramic electronic device which is produced by the above-described manufacturing method and which has outstanding impact resistance and improved miniaturization.

A method for manufacturing a multilayer ceramic electronic device according to a preferred embodiment of the present invention in which a surface mount electronic device is mounted on a first principal surface of a multilayer ceramic element assembly, the method includes the steps of preparing an unfired seat-portion-equipped multilayer ceramic element assembly provided with an unfired multilayer ceramic element assembly in which unsintered ceramic base material layers are laminated and a predetermined first conductor pattern is disposed, and a seat portion arranged to mount the above-described surface mount electronic device, the seat portion being arranged in at least a portion of the first principal surface of the multilayer ceramic element assembly, including a non-metallic inorganic powder as a primary component, having a second conductor pattern connected to the surface mount electronic device, and a resin introduction portion located outside a vertically projected region of the surface mount electronic device, firing the unfired seat-portion-equipped multilayer ceramic element assembly, mounting the surface mount electronic device on the seat portion of the fired seat-portion-equipped multilayer ceramic element assembly with the second conductor pattern disposed therebetween, and filling a resin from the resin introduction portion into the seat portion including the non-metallic inorganic powder as the primary component and between the seat portion and the surface mount electronic device, and curing the resin.

The seat portion including the non-metallic inorganic powder as the primary component is preferably made of a porous ceramic compact.

The unsintered ceramic base material layers and shrinkage restriction layers arranged to restrict shrinkage of the unsintered ceramic base material layers in a direction substantially perpendicular to a thickness direction are preferably laminated so as to define the unfired multilayer ceramic element assembly.

The seat portion is preferably provided with via hole conductors defining the second conductor pattern while one end surface of each via hole conductor is preferably exposed at the surface of the seat portion, and the surface mount electronic device is mounted on the one end surface of each via hole conductor exposed at the surface with an electrically conductive joining member disposed therebetween.

The second conductor pattern of the seat portion preferably connects the surface mount electronic device mounted on the seat portion and the first conductor pattern of the multilayer ceramic element assembly.

The surface mount electronic device is preferably a semiconductor element.

When a plurality of surface mount electronic devices are mounted on the seat portion, a resin introduction portion common to the individual surface mount electronic devices is preferably disposed on the seat portion, the resin is preferably filled from the common resin introduction portion so as to fill the resin into the seat portion and between the seat portion and the plurality of surface mount electronic devices.

Surface mount electronic devices other than the above-described surface mount electronic device mounted on the seat portion are mounted on regions, in which the seat portion is not disposed, of the first principal surface of the multilayer ceramic element assembly.

An unfired multilayer ceramic element assembly having a structure in which the shrinkage restriction layer is disposed on the first principal surface side is formed as the unfired multilayer ceramic element assembly.

A region other than the resin introduction portion in the seat portion is preferably located inside the vertically projected region of the surface mount electronic device mounted on the seat portion.

The thickness of the seat portion is preferably about 15 μm to about 150 μm, for example.

The unsintered ceramic base material layer is preferably an unsintered ceramic base material layer including a low-temperature-sinterable ceramic as a primary component and the shrinkage restriction layer includes a hard-to-sinter ceramic, which is not substantially sintered at a sintering temperature of the low-temperature-sinterable ceramic, as a primary component.

The non-metallic inorganic powder defining the seat portion is preferably a ceramic powder which is not substantially sintered at a sintering temperature of the ceramic defining the unsintered ceramic base material layer.

A multilayer ceramic electronic device according to another preferred embodiment of the present invention includes a surface mount electronic device mounted on a first principal surface of a multilayer ceramic element assembly, the multilayer ceramic electronic device including a multilayer ceramic element assembly including laminated ceramic base material layers and a predetermined first conductor pattern, a seat portion arranged to mount the surface mount electronic device, the seat portion being disposed in at least a portion of the first principal surface of the multilayer ceramic element assembly, including a non-metallic inorganic powder as a primary component, having a second conductor pattern connected to the surface mount electronic device, and having a resin introduction portion located outside a vertically projected region of the surface mount electronic device, and the surface mount electronic device mounted on the seat portion with the second conductor pattern disposed therebetween, wherein a resin is filled in at least the seat portion including the non-metallic inorganic powder as the primary component.

Resins having substantially the same composition are preferably filled in the seat portion including the non-metallic inorganic powder as a primary component and between the seat portion and the surface mount electronic device, the resins preferably being filled through the resin introduction portion.

The surface mount electronic device is preferably electrically connected to the first conductor pattern of the multilayer ceramic element assembly with the second conductor pattern of the seat portion arranged therebetween.

In the method for manufacturing a multilayer ceramic electronic device according to preferred embodiments of the present invention, the unfired seat-portion-equipped multilayer ceramic element assembly provided with the unfired multilayer ceramic element assembly, in which the unsintered ceramic base material layers are laminated and the predetermined first conductor pattern is disposed, and the seat portion, which is disposed in at least a portion of the first principal surface of the multilayer ceramic element assembly, which includes the non-metallic inorganic powder as the primary component, which has the second conductor pattern connected to the surface mount electronic device, and which has the resin introduction portion located outside the vertically projected region of the surface mount electronic device, is formed. After firing, the surface mount electronic device is mounted on the seat portion, and the resin is filled from the resin introduction portion into the seat portion and between the seat portion and the surface mount electronic device. Consequently, the seat portion has a structure in which an aggregate of the non-metallic inorganic powder is impregnated with the resin. Therefore, the seat portion can be reliably adhered to the first principal surface of the multilayer ceramic element assembly, such that a multilayer ceramic electronic device including the seat portion having high mechanical strength and exhibiting excellent bonding strength with respect to the multilayer ceramic element assembly is produced.

Since the seat portion includes the resin introduction portion located outside the vertically projected region of the surface mount electronic device, the resin can be easily and reliably filled in the seat portion. More particularly, gaps in the non-metallic inorganic powder defining the seat portion, and gaps between the seat portion and the surface mount electronic device are reliably filled via the capillary effect.

Furthermore, the resin filled through the resin introduction portion is reliably maintained in the seat portion and the gaps between the seat portion and the surface mount electronic device. Therefore, the resin does not leak from the seat portion to the surroundings, so that an adverse effect due to leakage of the resin is prevented from occurring in the surrounding regions.

By preventing leakage of the resin from the region in which the seat portion is disposed to the surrounding regions or to the regions adjacent to the region occupied by the surface mount electronic device mounted on the seat portion, distances between the seat portion and other surface mount electronic devices disposed in the regions surrounding the seat portion can be reduced, and other surface mount electronic devices can be mounted more densely in the surroundings of the surface mount electronic device mounted on the seat portion, so that high-density, high-accuracy mounting form can be achieved.

Moreover, the resin filled between the surface mount electronic device and the seat portion functions as a bonding layer to bond the surface mount electronic device and the seat portion, and, in addition, functions as an impact absorption layer. Therefore, the impact resistance can be improved while the surface mount electronic device is fixed to the seat portion reliably.

Therefore, a highly reliable multilayer ceramic electronic device can be effectively produced, wherein leakage of an underfill resin provided to fix a surface mount electronic device does not occur and high-density, high-accuracy mounting of a surface mount electronic device is achieved.

In preferred embodiments of the present invention, for example, transistor, ICs, and LSIs are discussed as examples of the surface mount electronic device mounted on the seat portion. However, the structure of the multilayer ceramic electronic device according to preferred embodiments of the present invention is suitable for a mounting structure of a surface mount electronic device including a plurality of narrow-gap I/O terminals at a high density in substantially the same plane and, therefore, is particularly useful in an arrangement in which BGA (Ball Grid Array) connection type large-scale semiconductor elements, e.g., ICs and LSIs, are mounted in the state of bare chips.

Even when a configuration does not include the resin introduction portion which is provided on the seat portion, by designing the form of resin supply, the resin can be filled into the seat portion while leakage of the resin to the surroundings of the seat portion is prevented. However, according to preferred embodiments of the present invention, as described above, the resin can be filled in the seat portion and between the seat portion and the surface mount electronic device while leakage of the resin to the surroundings of the seat portion is prevented merely by supplying the resin to the resin introduction portion located outside the vertically projected region of the surface mount electronic device. Therefore, preferred embodiments of the present invention are useful from the viewpoint of simplifying production equipment, simplifying production steps, facilitating mounting of surface mount electronic devices.

When the seat portion including the non-metallic powder as the primary component is formed from the porous ceramic compact, the resin selectively penetrates and infiltrates into the porous seat portion 11 and between the semiconductor element 13 and the seat portion 11 through capillary effect, and, therefore, leakage of the resin filled from the resin introduction portion to the outside of the seat portion is effectively prevented.

When the unfired multilayer ceramic element assembly has a structure in which the unsintered ceramic base material layers and the shrinkage restriction layers are laminated, shrinkage in a direction substantially perpendicular to a lamination direction in a firing step is prevented, so that a multilayer ceramic electronic device having outstanding dimensional accuracy and high reliability can be obtained.

The second conductor pattern of the seat portion is preferably defined by via hole conductors while one end surface of each via hole conductor is exposed at the surface of the seat portion, and the surface mount electronic device is mounted on the one end surface of each via hole conductor exposed at the surface with an electrically conductive joining member therebetween, such that the reliability in connection and the fixing of the surface mount electronic device to the seat portion are improved.

That is, the surface mount electronic device is bonded to the one end surface of the via hole conductor disposed such that the one end surface is exposed at the surface of the seat portion with an electrically conductive joining member, e.g., solder, therebetween. Therefore, the surface mount electronic device can be reliably bonded to the multilayer ceramic element assembly with the seat portion disposed therebetween, so that excellent impact resistance can be achieved as compared to an arrangement in which a surface mount electronic device and a thin-film shaped electrode of a substrate are directly electrically bonded as in the related art. Consequently, even if an impact is applied to the multilayer ceramic element assembly, the seat portion suppresses transfer of the impact to the bonding portion of the surface mount electronic device and the electrically conductive jointing member, so that a connection structure of the surface mount electronic device can be obtained, wherein the reliability of the connection is improved.

When the second conductor pattern of the seat portion connects the surface mount electronic device and the first conductor pattern of the multilayer ceramic element assembly, mechanical connection and electrical connection of the surface mount electronic device can be performed at the same time, so that miniaturization of a product and simplification of a configuration are achieved.

When the semiconductor element is mounted on the seat portion in the arrangement of preferred embodiments of the present invention, the multilayer ceramic electronic device is suitable for bare chip mounting of a BGA connection type semiconductor element including a plurality of narrow-gap I/O terminals at a high density in substantially the same plane. Therefore, when BGA connection type large-scale semiconductor elements, e.g., ICs and LSIs, are mounted as bare chips, high-density, high-accuracy mounting can be performed.

When the plurality of surface mount electronic devices are mounted on the seat portion, the plurality of surface mount electronic devices can be efficiently mounted and fixed to the seat portion by providing the resin introduction portion common to the individual surface mount electronic devices on the seat portion and filling the resin from the common resin introduction portion.

When other surface mount electronic devices are mounted on regions of the first principal surface of the multilayer ceramic element assembly in which the seat portion is not disposed, a small, high-performance multilayer ceramic electronic device in which the mounting density of devices is increased can be efficiently produced.

The types of surface mount electronic devices mounted on the regions, in which the seat portion is not disposed, are not specifically limited. Examples thereof include passive elements, e.g., a chip capacitor, a chip resistance, a chip thermistor, and a chip inductor, having a number of I/O terminals that is smaller than that of the surface mount electronic device disposed on the seat portion.

When an unfired multilayer ceramic element assembly including shrinkage restriction layer disposed on the first principal surface side is formed as the unfired multilayer ceramic element assembly, it is possible to reliably prevent shrinkage of the multilayer ceramic element assembly in a direction substantially perpendicular to the thickness direction of the shrinkage restriction layer in the firing step and to obtain a multilayer ceramic element assembly having a relatively large mechanical strength. Consequently, a multilayer ceramic electronic device having outstanding dimensional accuracy and high reliability can be efficiently produced.

That is, when the shrinkage restriction layer is also disposed on the first principal surface, a compressive stress due to the ceramic layer occurs with respect to the shrinkage restriction layer. In contrast, a tensile stress for the purpose of shrinkage compensation due to the shrinkage restriction layer occurs with respect to the ceramic layer. In general, the strength of the ceramic substrate in the state in which a compressive stress is applied to the surface increases. Therefore, it is preferable that the shrinkage restriction layer is also disposed on the side of the first principal surface so as to improve the strength of the multilayer ceramic element assembly.

When a region other than the resin introduction portion in the seat portion is located inside the vertically projected region of the surface mount electronic device mounted on the seat portion, a region on which other surface mount electronic devices can be mounted is enlarged. Consequently, a small, high-density, high-reliability multilayer ceramic electronic device can be obtained, in which more surface mount electronic devices can be mounted.

When the thickness of the seat portion is specified to be within the range of about 15 μm to about 150 μm, a highly reliable multilayer ceramic electronic device that has outstanding impact resistance, that can be miniaturized, and that has outstanding dimensional accuracy can be obtained while not increasing the height of the product.

If the thickness of the seat portion is less than about 15 μm, an impact tends to be concentrated on the bonding portion between the seat portion and the ceramic element assembly, a breakage suppressing effect due to an impact is reduced, and the impact resistance becomes insufficient. If the thickness of the seat portion exceeds about 150 μm, it is difficult to sufficiently fill the resin into the seat portion. Therefore, it is preferable that the thickness of the seat portion is in the range of about 15 μm to about 150 μm.

When the unsintered ceramic base material layer is made of an unsintered ceramic base material layer including low-temperature-sinterable ceramic as a primary component and the shrinkage restriction layer is made of a shrinkage restriction layer including hard-to-sinter ceramic, which is substantially not sintered at a sintering temperature of the low-temperature-sinterable ceramic, firing can be reliably performed at a relatively low temperature without causing shrinkage in a direction substantially perpendicular to the thickness direction of the unsintered ceramic base material layer. Therefore, a highly reliable multilayer ceramic electronic device having outstanding dimensional accuracy and desired characteristics can be obtained while reducing the production costs.

When the seat portion and the multilayer ceramic element assembly can be fired at the same time by using a ceramic powder which is not substantially sintered at a sintering temperature of the ceramic defining the ceramic base material layer as the non-metallic inorganic powder defining the seat portion, distortion and deviation in the location of the mounting region caused by differences in the firing shrinkage behavior can be suppressed. Furthermore, gaps are provided in the aggregate of the ceramic powder substantially not fired in the firing step to the extent that the aggregate does not collapse. Therefore, the resin can easily penetrate therein.

A multilayer ceramic electronic device according to preferred embodiments of the present invention includes a multilayer ceramic element assembly having a predetermined first conductor pattern, a seat portion arranged to mount the surface mount electronic device, the seat portion being disposed in at least a portion of the first principal surface of the multilayer ceramic element assembly, having a second conductor pattern, including the resin introduction portion located outside the vertically projected region of the surface mount electronic device, and including a non-metallic inorganic powder as a primary component, and the surface mount electronic device mounted on the seat portion with the above-described second conductor pattern therebetween, wherein the resin is filled in at least the seat portion. Therefore, the seat portion on which the surface mount electronic device is mounted is firmly fixed to the multilayer ceramic element assembly with the resin.

Since the resin introduction portion located outside the vertically projected region of the surface mount electronic device is provided, the resin can be easily and reliably filled between the non-metallic inorganic powder defining the seat portion while leakage of the resin to the surroundings of the seat portion is prevented by filling the resin from above.

Since leakage of the resin does not occur and surface mount electronic devices can also be mounted in the surroundings of the seat portion at a high density, high accuracy mounting is achieved.

Consequently, a highly reliable multilayer ceramic electronic device having outstanding impact resistance and that can be miniaturized is provided.

Examples of the configuration of the seat portion having a structure in which the resin is filled and is adhered to the first principal surface of the multilayer ceramic element assembly with at least the resin preferably include a seat portion adhered to the first principal surface of the multilayer ceramic element assembly with at least a resin by impregnating an aggregate of the ceramic powder which is a non-metallic inorganic powder, that is, a porous ceramic compact, with the resin and conducting curing. The aggregate is prepared by heat-treating the unfired ceramic compact disposed on the first principal surface of the multilayer ceramic element assembly so as to volatilize a binder component included in a sheet and sinter a portion of the sheet or cause the portion of the sheet to be in a porous state in which the sheet is substantially not sintered but a predetermined shape is maintained.

Preferably, substantially the same resin that is filled into the seat portion is also used as an underfill resin that is filled into the gap between the surface mount electronic device and the seat portion. Alternatively, a different type of resin from the type of resin filled into the seat portion can also be filled as the underfill resin. When the same resin as that filled into the seat portion is filled as an underfill resin, filling of the resin into the seat portion and the gap between the surface mount electronic device and the seat portion can be performed in a single operation by supplying a total amount of the resin required for filling the seat portion and the resin required for filling the gap between the surface mount electronic device and the seat portion from the resin introduction portion of the seat portion.

When resins having the same composition are filled in the seat portion including the non-metallic inorganic powder as a primary component and between the seat portion and the surface mount electronic device, the resins being filled through the resin introduction portion, it is possible to form a resin layer having a high affinity for the resin defining the seat portion between the surface mount electronic device and the seat portion, and a multilayer ceramic electronic device having outstanding impact resistance and reliability can be provided.

With a configuration in which the surface mount electronic device is electrically connected to the first conductor pattern of the multilayer ceramic element assembly with the second conductor pattern of the seat portion, mechanical connection and electrical connection of the surface mount electronic device can be performed at the same time, so that a small, high-performance, high-reliability multilayer ceramic electronic device can be provided.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 13A and 13B are diagrams showing modified examples of the configuration of a seat portion defining a multilayer ceramic electronic device according to preferred embodiments of the present invention.

FIG. 14 is a diagram showing another modified example of the configuration of a seat portion defining a multilayer ceramic electronic device according to preferred embodiments of the present invention.

FIG. 15A is a front sectional view, and FIG. 15B is a plan view.

DETAILED DESCRIPTION OF PREFERRED EMBODIMENTS

Preferred embodiments of the present invention will be described below with reference to the drawings.

First Preferred Embodiment

Figure 1:
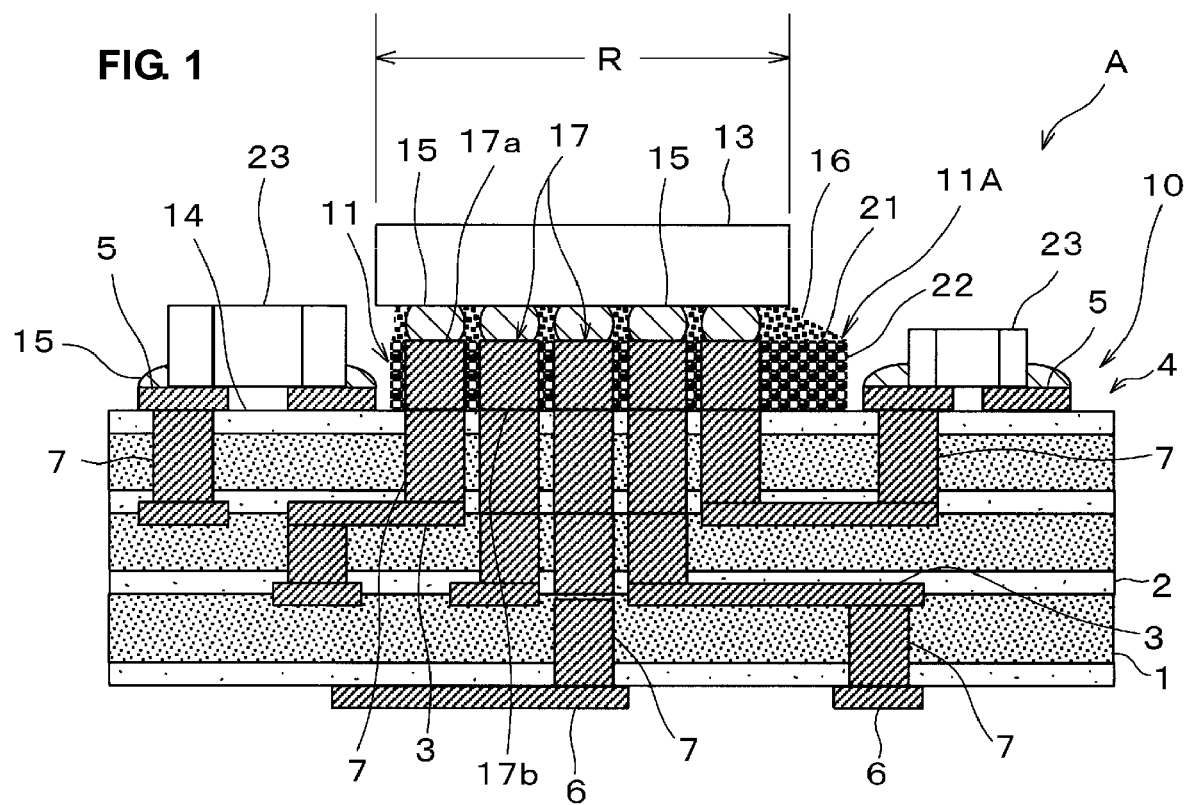
FIG. 1 is a diagram showing the configuration of a multilayer ceramic electronic device according to a preferred embodiment of the present invention.

FIG. 1 is a sectional view showing the entire structure of a multilayer ceramic electronic device according to a preferred embodiment of the present invention.

Figure 2A:
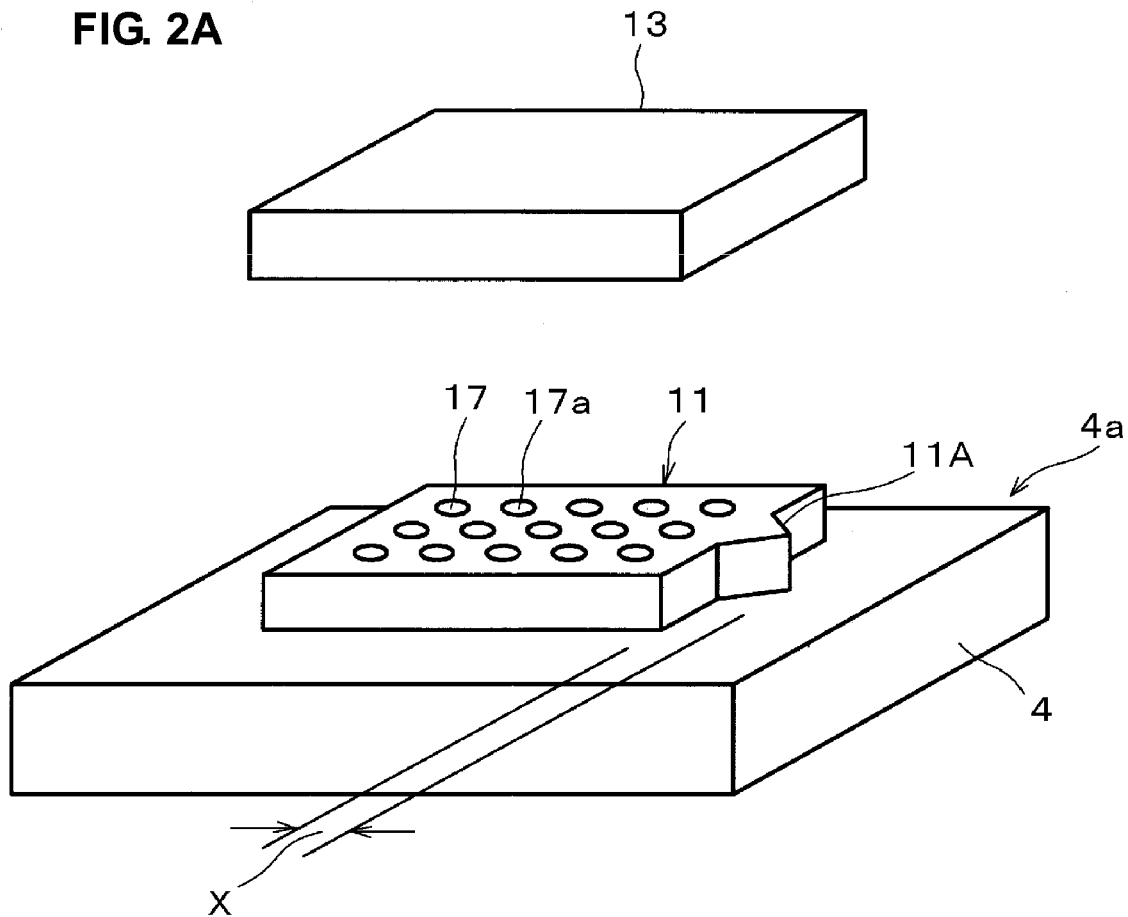
FIG. 2A is an exploded perspective view showing a portion of the multilayer ceramic electronic device shown in FIG. 1.
Figure 2B:
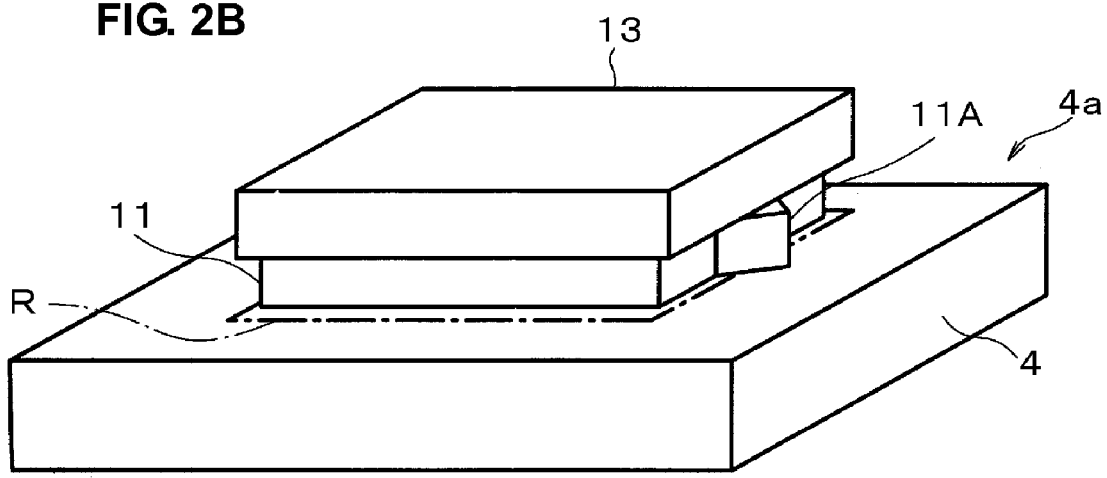
FIG. 2B is a perspective view showing a state in which a semiconductor element is mounted on the seat portion.

Furthermore, FIG. 2A is an exploded perspective view showing a portion (arrangement of a seat portion on a multilayer ceramic element assembly) of the multilayer ceramic electronic device shown in FIG. 1, and FIG. 2B is a perspective view showing a state in which a semiconductor element is mounted on the seat portion. In FIGS. 2B and 2B, only the multilayer ceramic element assembly, the seat portion, and the semiconductor element are shown, and the other elements are omitted.

As shown in FIGS. 1 to 2B, a multilayer ceramic electronic device A according to the first preferred embodiment of the present invention includes a multilayer ceramic element assembly 4 including first ceramic layers 1 which define ceramic base material layers, second ceramic layers 2 which define shrinkage restriction layers which are laminated in contact with principal surfaces of the first ceramic layers and which are arranged to restrict shrinkage of the ceramic base material layers in a direction substantially perpendicular to a thickness direction of the first and second ceramic layers 1 and 2 in a firing step, and internal in-plane conductors 3 define conductor patterns arranged between layers of the first ceramic layers 1 and the second ceramic layers 2.

External conductors 5 and terminal electrodes 6 are disposed on the surfaces of the multilayer ceramic element assembly 4. Via hole conductors 7 are arranged to penetrate the first ceramic layers 1 and/or second ceramic layers 2. The internal in-plane conductors 3 disposed in different layers, the internal in-plane conductor 3 and the external conductor 5, or the internal in-plane conductor 3 and the terminal electrode 6 are electrically connected to each other with via hole conductors 7 extending therebetween.

The multilayer ceramic electronic device A is provided with a seat portion 11 made of a material including non-metallic inorganic powder 21 and a resin 22. That is, in this preferred embodiment, the seat portion 11 includes an aggregate of the non-metallic inorganic powder 21 that is adhered to the first principal surface 14 with the resin 22, in a portion of an upper surface (first principal surface) 14 of the multilayer ceramic element assembly 4 provided with the first and the second ceramic layers 1 and 2 and internal in-plane conductors 3. The seat portion 11 includes a seat portion via hole conductors 17 arranged such that one end surface (upper end surface) 17a of the seat portion via hole conductor 17 is exposed at the upper surface side of the seat portion 11 and the other end surface 17b is connected to the internal in-plane conductor 3 with a via hole conductor 7 disposed in the multilayer ceramic element assembly 4 therebetween.

In this preferred embodiment, the internal in-plane conductors 3, the external conductors 5, and the via hole conductors 7, which are disposed in the multilayer ceramic element assembly 4, define the first conductor pattern. The seat portion via hole conductors 17 disposed in the seat portion define the second conductor pattern.

The diameter of the seat portion via hole conductor 17 disposed in the seat portion 11 is preferably in the range of about 30 μm to about 120 μm, for example.

A semiconductor element 13 defining a surface mount electronic device is disposed on the seat portion 11. The semiconductor element 13 is electrically connected to the seat portion via hole conductors 17 disposed in the seat portion with solder 15 which defines an electrically conductive joining member therebetween.

Furthermore, a resin layer 16 filled with a resin 22 preferably having substantially the same composition as the resin 22 used for the seat portion 11 is disposed in the gap between the seat portion 11 and the semiconductor element 13.

In the seat portion 11 of the multilayer ceramic electronic device A, as shown in FIGS. 2A and 2B, a resin introduction portion 11A is provided outside a vertically projected region R of the surface mount electronic device (semiconductor element) 13. In this preferred embodiment, a protrusion portion is provided as the resin introduction portion 11A so as to protrude from one side of the seat portion 11 to a location outside the vertically projected region R of the semiconductor element 13.

The resin 22 filling the seat portion 11 is filled into the seat portion 11 through this resin introduction portion 11A. The resin layer 16 disposed between the seat portion 11 and the semiconductor element 13 is also formed by filling the resin 22 from this resin introduction portion 11A.

Preferably, the thickness of the seat portion 11 is in the range of about 15 μm to about 150 μm after firing, and more preferably in the range of about 30 μm to about 100 μm, for example.

In the multilayer ceramic electronic device A, the first ceramic layer 1 is formed by sintering a first ceramic material and substantially defines the substrate characteristics of the multilayer ceramic substrate 10. Preferably, the thickness of the first ceramic layer 1 is in the range of about 8 μm to about 100 μm after firing, for example. The thickness of the first ceramic layer 1 is not necessarily limited to the above-described range. However, it is preferable that the thickness is less than or equal to the thickness at which shrinkage can be restricted by the shrinkage restriction layer (that is, the second ceramic layer) 2. The thicknesses of all of the first ceramic layers 1 are not necessarily substantially the same.

As for the first ceramic material, A material, a portion of which (for example, glass component) penetrates the second ceramic layer 2 during firing, is used for the first ceramic material. Preferably, the first ceramic material is LTCC (Low Temperature Co-fired Ceramic), for example, which can be fired at relatively low temperatures, such as about 1,050° C. or less such that co-firing with a conductor made of a low melting point metal, e.g., silver or copper, can be performed. Preferably, glass ceramic in which alumina and borosilicate glass are mixed, Ba—Al—Si—B oxide ceramic which generates a glass component during firing, and other suitable materials can be used.

When the first ceramic material includes a low-temperature-sinterable ceramic raw material powder as a primary component, main constituent materials for the via hole conductor 7, the seat portion via hole conductor 17, the internal in-plane conductor 3, and other elements can be selected from metals and alloys preferably including at least one type selected from the group consisting of Ag, Au, and Cu having excellent high-frequency characteristics as a primary component, for example. This alloy may preferably include Pd, W, Ni, and other suitable materials.

The second ceramic material defining the shrinkage restriction layer (that is, second ceramic layer) 2 is adhered by a portion of the first ceramic material (glass component) which penetrates the second ceramic material 2 from the first ceramic layer 1. Consequently, the first ceramic layer 1 and the second ceramic layer 2 are bonded as the second ceramic layer is solidified.

Alumina, zirconia, silica, and other suitable material can preferably be used for the second ceramic material defining the shrinkage restriction layer (second ceramic layer) 2. The second ceramic layer 2 includes the unsintered second ceramic material having a sintering temperature greater than that of the first ceramic material and, therefore, the second ceramic layer 2 provides a function of restricting shrinkage of the first ceramic layer 1 in a direction substantially perpendicular to a thickness direction of the first and second ceramic layers 1 and 2 during a firing process. Furthermore, as described above, the second ceramic layer 2 is adhered and bonded to the first ceramic layer 1 by the penetration of a portion of the first ceramic material. Therefore, preferably, the thickness of the second ceramic layer 2 after firing is in the range of about 1 μm to about 10 μm, and further preferably within the range of about 2 μm to about 7 μm, for example.

The second ceramic layer 2 may preferably include a glass component that functions as an adhesion member of the second ceramic layer as long as no shrinkage of the second ceramic layer 2 occurs during firing. Preferably, the glass component of the second ceramic layer 2 has substantially the same composition as that of a glass component added to the first ceramic layer 1 or a glass component generated in the first ceramic layer 1 during firing.

In this preferred embodiment, a Ba—Al—Si—B oxide ceramic material was used for the first ceramic layer 1, and alumina was used as the ceramic material defining the second ceramic layer 2. The thickness of the first ceramic layer 1 was adjusted to be about 50 μm after firing, and the thickness of the second ceramic layer 2 was adjusted to be about 5 μm after firing.

For the conductor portions, e.g., the internal in-plane conductor 3, the external conductor 5, and the terminal electrode 6, as long as an electrically conductive component that is co-sinterable with the first ceramic layer 1 is included as a primary component, various known materials can preferably be used. Specifically, Cu, Ag, Ni, Pd, and alloys thereof can be used, for example. In this preferred embodiment, conductor portions were formed by using a material primarily including a Cu component (for example, an electrically conductive paste including a Cu powder as an electrically conductive component).

Next, a method for manufacturing the multilayer ceramic electronic device A according to preferred embodiments of the present invention will be described.

Figure 3:
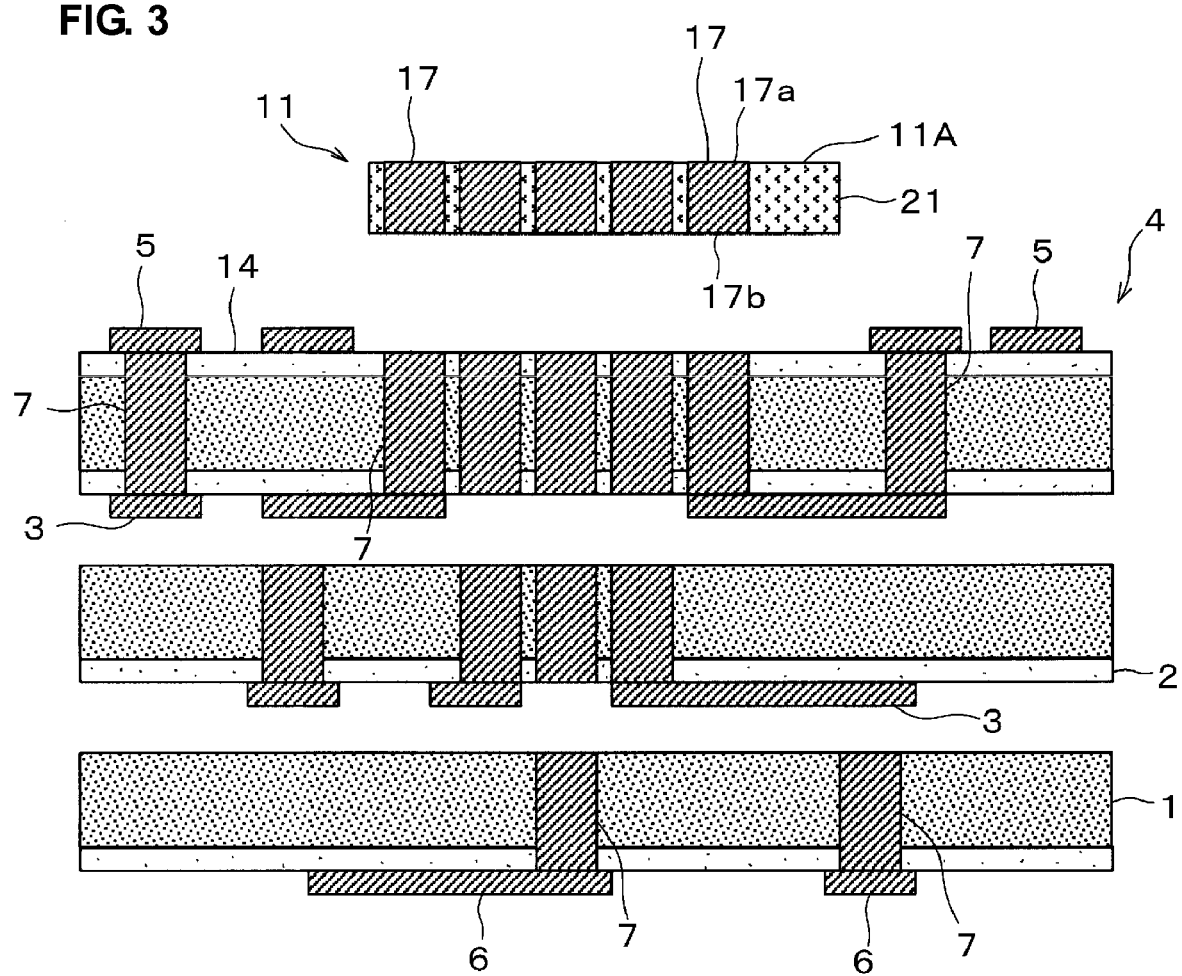
FIG. 3 is a diagram showing one step of a method for manufacturing a multilayer ceramic electronic device according to a preferred embodiment of the present invention.

(1) As shown in FIG. 3, an electrically conductive paste including a Cu powder, for example, as an electrically conductive component is printed at predetermined locations of ceramic green sheets defining the first ceramic layers 1 and the second ceramic layers 2 and, thereby, the internal in-plane conductors 3, the external conductors 5, the via hole conductors 7, and the like are provided.

(2) For the seat portion 11, a green sheet including a non-metallic inorganic powder 21 (for example, a ceramic powder, e.g., alumina, zirconia, or GaN), which is not sintered at a firing temperature of the first ceramic material, as a primary component is prepared, the green sheets being provided with via hole conductors (seat portion via hole conductors) 17 including, for example, Ag or Cu as a primary component.

As shown in FIGS. 1 to 2B, the seat portion 11 is provided with the resin introduction portion 11A located outside a vertically projected region R of the semiconductor element (surface mount electronic device) 13 mounted on the seat portion 11.

In this preferred embodiment, a protrusion portion formed so as to protrude from one side to a location outside of the vertically projected region R of the semiconductor element 13 defines the resin introduction portion 11A of the seat portion 11.

The thickness of the seat portion 11 is set to be in the range of about 15 μm to about 150 μm after firing.

The seat portion 11 (seat portion before firing) can be produced by, for example, a method as described below.

Figure 9:
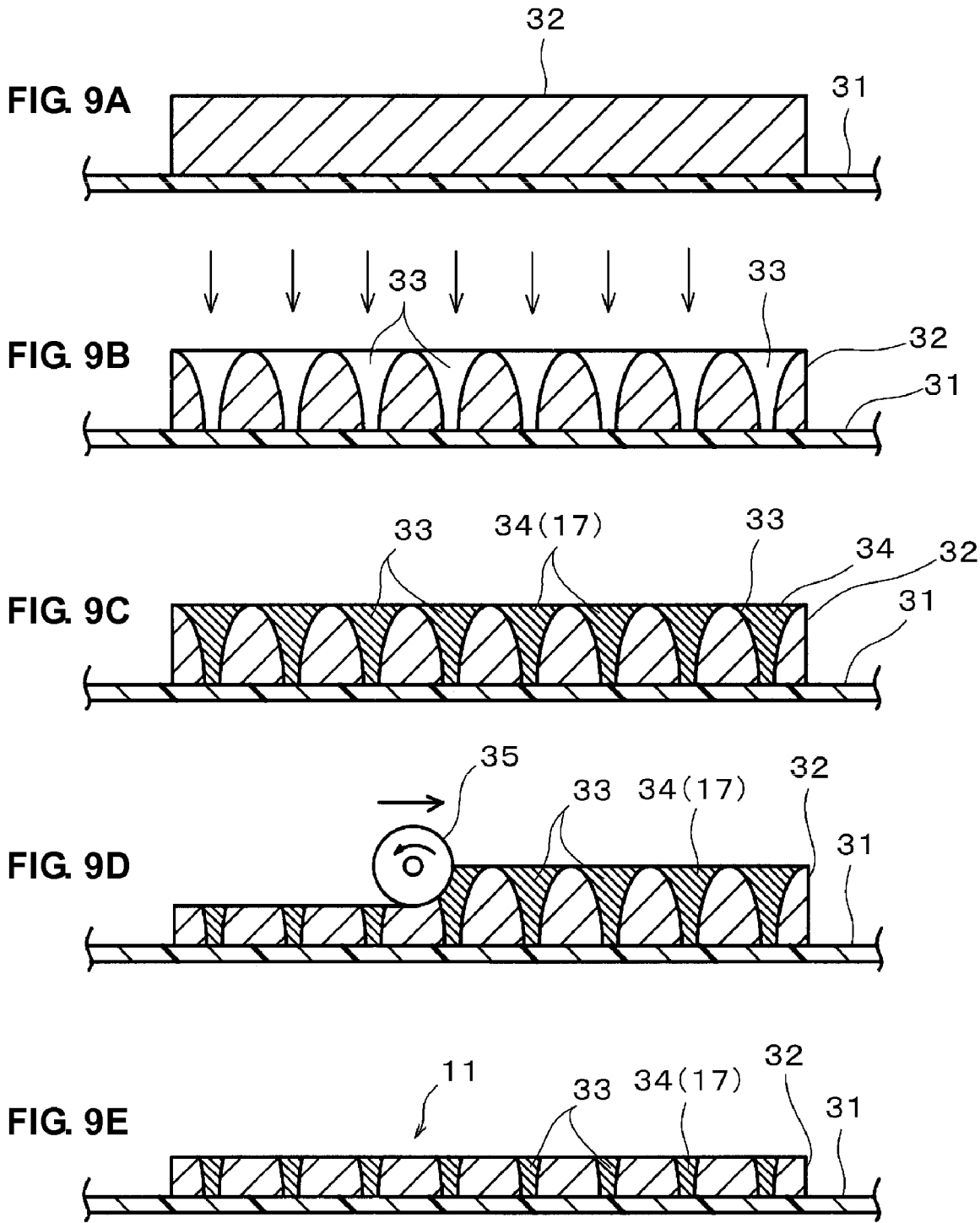
FIGS. 9A to 9E are diagrams showing a method for forming a seat portion constituting a multilayer ceramic electronic device according to a preferred embodiment of the present invention.

As shown in FIG. 9A, a green sheet 32 including a non-metallic inorganic powder (for example, a ceramic powder, e.g., alumina, zirconia, or GaN), which is not sintered at a firing temperature of the first ceramic material, as a primary component is formed on a carrier film 31. Thereafter, as shown in FIG. 9B, for example, through holes 33 for via hole conductors are formed at locations of the green sheet 32 by a laser beam machining method, for example. In this preferred embodiment of the present invention, a green sheet primarily including alumina was used as the green sheet for the seat portion.

As shown in FIG. 9C, the through holes 33 are filled with an electrically conductive paste 34.

If the state shown in FIG. 9C is maintained, the electrically conductive paste 34 filled in the individual through holes 33 may short-circuit. Therefore, as shown in FIG. 9D, a surface of the green sheet 32 is ground with an abrasive roll 35 so as to remove the electrically conductive paste 34 covering the surface and a portion of the green sheet 32 on the upper surface side and, in addition, to flatten the upper surface. In this manner, as shown in FIG. 9E, the seat portion (unfired seat portion) 11 has a substantially flat upper surface, is not likely to short circuit, and includes via hole conductors (seat portion via hole conductors 17) having a narrow pitch.

The unfired seat portion 11 is disposed on a first principal surface 14 of the unfired multilayer ceramic element assembly 4 such that the upper surface shown in FIG. 9E is bonded to the first principal surface 14 of the multilayer ceramic element assembly 4, and the carrier film 31 (FIG. 9E) is removed, so that a state in which the seat portion 11 is disposed at the predetermined location of the unfired multilayer ceramic element assembly 4 is achieved.

Alternatively, a lower surface of the unfired seat portion 11 (the side of the carrier film 31) may be bonded to the first principal surface 14 of the multilayer ceramic element assembly 4. For example, although not specifically shown in FIGS. 9A to 9E, it is also possible to use a configuration in which the unfired seat portion 11 is disposed on a holding table with the surface not provided with the carrier film 31 facing the table, the carrier film 31 is removed and, thereafter, the unfired multilayer ceramic element assembly 4 is formed on the surface of the unfired seat portion 11 from which the carrier film 31 has been removed.

A ceramic green sheet made from substantially the same ceramic material as the ceramic material defining the second ceramic layer can also be used as a green sheet to form the seat portion.

It is also possible to use various ceramic green sheets having compositions that are different from the ceramic material defining the second ceramic layer.

Figure 4:
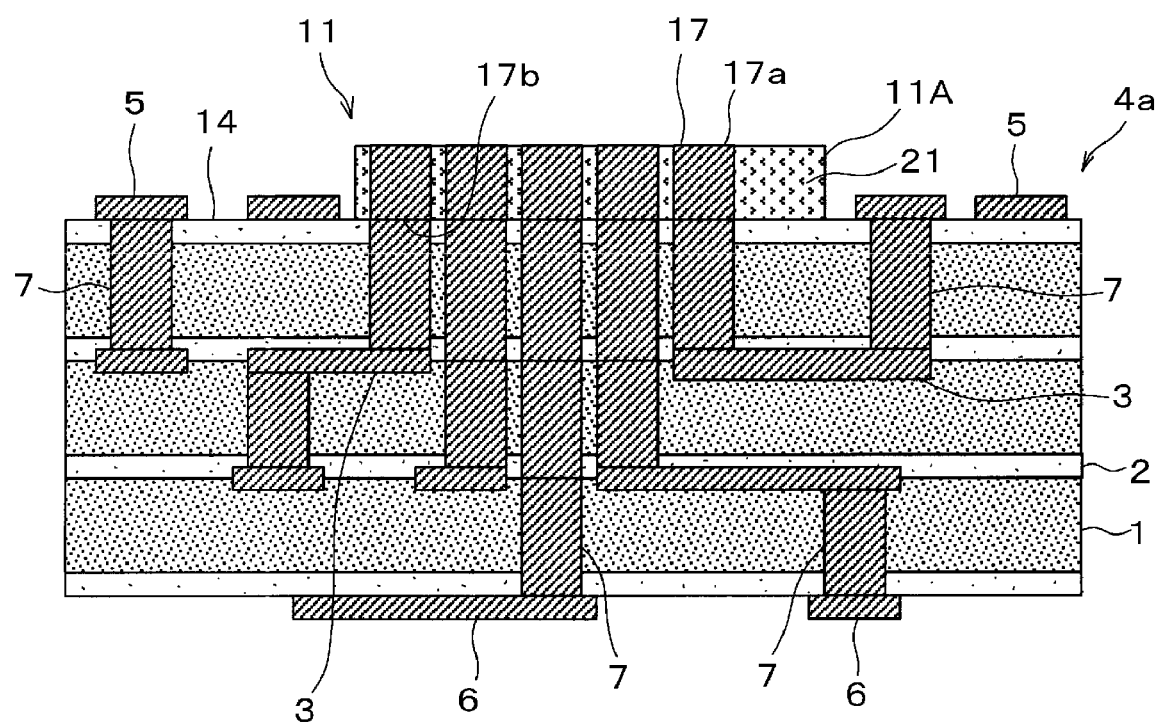
FIG. 4 is a diagram showing another step of a method for manufacturing a multilayer ceramic electronic device according to a preferred embodiment of the present invention.

(3) The ceramic green sheets and the seat portion obtained in the steps (1) and (2) are laminated and press-bonded in a predetermined order and direction, as shown in FIG. 4, so that a seat-portion-equipped green sheet compact (unfired seat-portion-equipped multilayer ceramic element assembly) 4a is formed.

Figure 5:
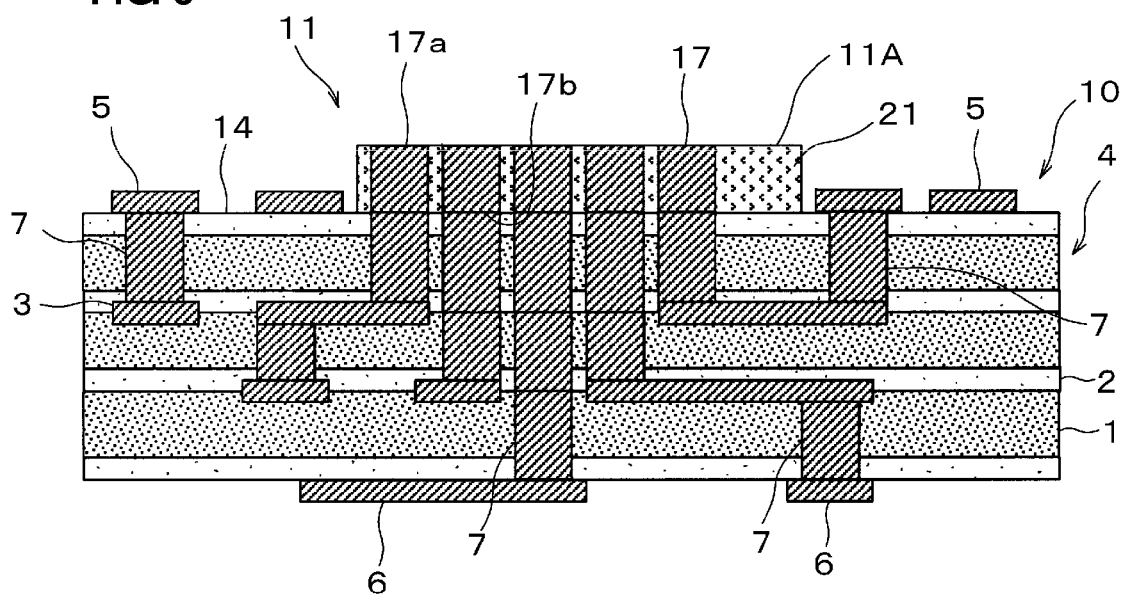
FIG. 5 is a diagram showing another step of a method for manufacturing a multilayer ceramic electronic device according to a preferred embodiment of the present invention.

(4) The unfired seat-portion-equipped multilayer ceramic element assembly 4a (refer to FIG. 4) is fired at a predetermined temperature and a predetermined atmosphere and, thereby, the multilayer ceramic substrate 10 provided with the seat portion 11 on the upper surface (first principal surface) 14 of the multilayer ceramic element assembly 4 is obtained (refer to FIG. 5). In this state, the seat portion 11 is a porous compact in which ceramic particles are aggregated.

At this time, the multilayer ceramic element assembly 4 is fired at a temperature at which the first ceramic material defining the multilayer ceramic element assembly 4 is sintered and the second ceramic material defining the multilayer ceramic element assembly 4 is not sintered. Consequently, when the first ceramic layer 1 made of the first ceramic material is going to shrink, the second ceramic layer 2 that functions as a shrinkage restriction layer, which is made of the second ceramic material, performs the function of restricting the shrinkage of the first ceramic layer 1. In this manner, the multilayer ceramic substrate 10 having high dimensional accuracy can be produced. When firing is conducted by the method described above, the multilayer ceramic element assembly 4 can be fired so as to shrink in a thickness direction (shrink from about 45% to about 65% of the thickness in the unfired state) but to not substantially shrink in a plane direction substantially perpendicular to the thickness direction.

The firing atmosphere is adjusted appropriately in accordance with the type of the first ceramic material, the type of electrically conductive powder included in the electrically conductive paste film, and other factors. In the present preferred embodiment, the firing was performed substantially in a reducing atmosphere at a maximum firing temperature of about 950° C. to about 1,000° C.

(5) The resulting multilayer ceramic substrate 10 is subjected to a surface treatment, as required, and thereafter, the surface mount electronic devices are mounted.

Various surface mount electronic devices can be mounted in accordance with the circuit to be formed. Specific examples include active elements e.g., transistors, ICs, and LSIs, and passive elements, e.g., chip capacitors, chip resistances, chip thermistors, and chip inductors.

In this preferred embodiment, in particular, semiconductor elements, e.g., ICs and LSIs, are preferably mounted.

Figure 6:
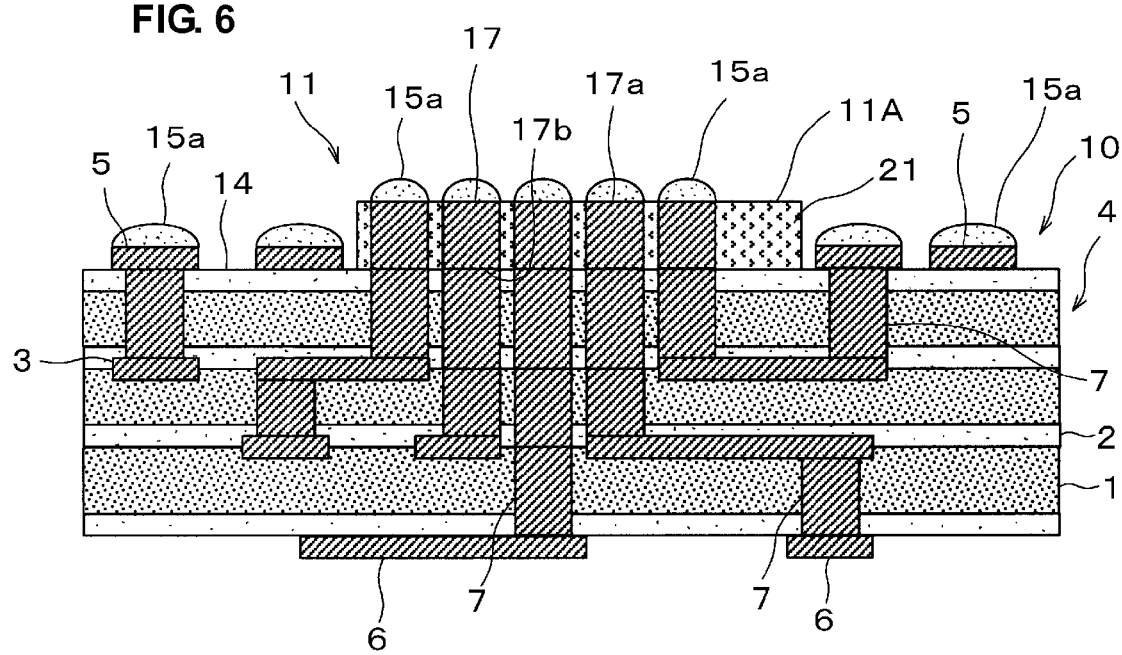
FIG. 6 is a diagram showing another step of a method for manufacturing a multilayer ceramic electronic device according to a preferred embodiment of the present invention.

(5-1) As shown in FIG. 6, a solder paste 15a is applied to the upper end surfaces 17a of the seat portion via hole conductors 17. The application method is not specifically limited, and various known methods, e.g., printing, dipping, and dispensing, can preferably be used.

At this time, the solder paste 15a is also applied to external conductors 5 which are disposed on regions not provided with the seat portion 11 in the first principal surface 14 of the multilayer ceramic element assembly 4 and which are provided to mount the other surface mount electronic devices (e.g., monolithic ceramic capacitor and other suitable electronic devices) 23.

Figure 7:
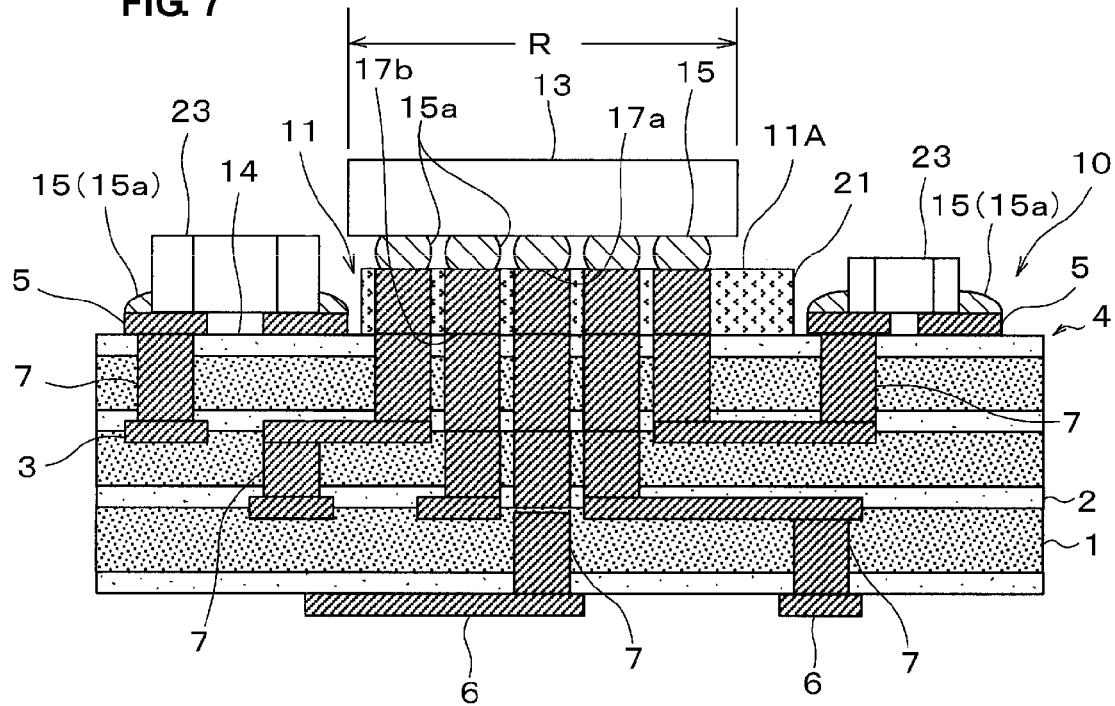
FIG. 7 is a diagram showing another step of a method for manufacturing a multilayer ceramic electronic device according to a preferred embodiment of the present invention.

(5-2) Thereafter, as shown in FIG. 7, the semiconductor element 13 is mounted on the solder paste 15a, and the other surface mount electronic devices 23 are mounted on regions not provided with the seat portion 11 in the upper surface 14 of the multilayer ceramic element assembly 4. The solder paste 15a is melted and solidified in a reflow furnace set to have a predetermined temperature profile, so that the semiconductor element 13 is bonded to the upper end surfaces 17a of the seat portion via hole conductors 17 and, in addition, the other surface mount electronic devices 23 are connected to the external conductors 5 disposed in regions surrounding the region provided with the seat portion 11 in the first principal surface 14 of the multilayer ceramic element assembly 4.

Figure 8:
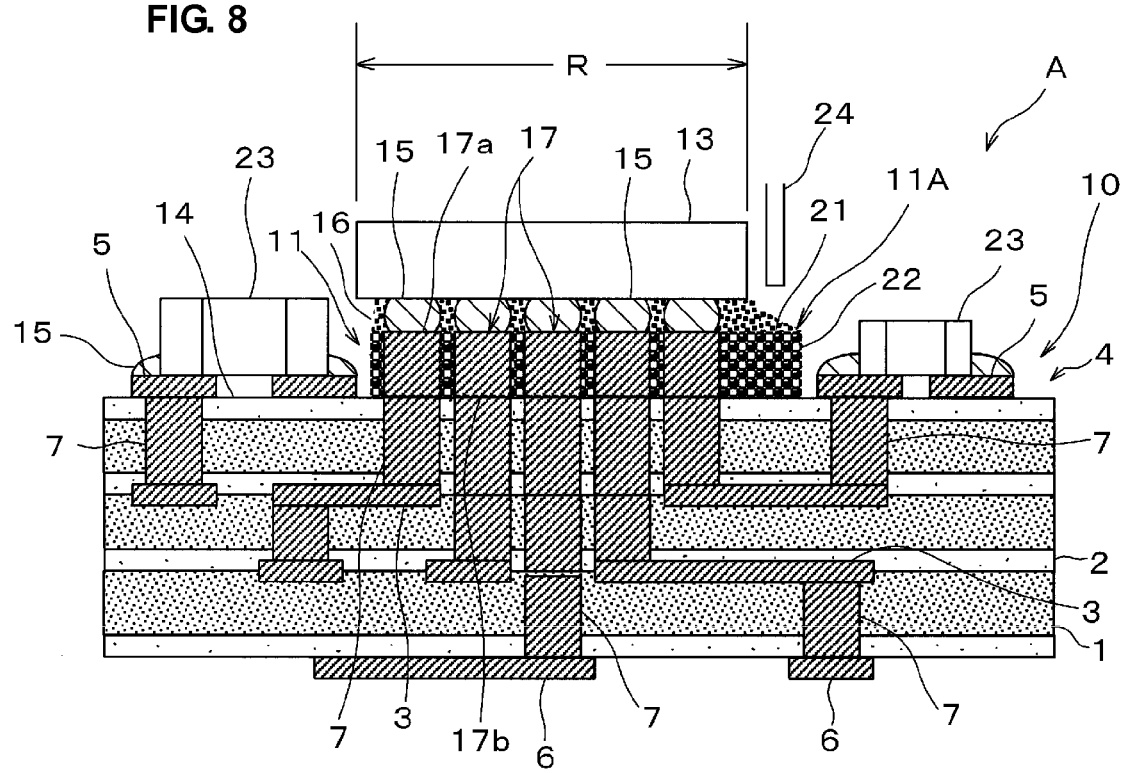
FIG. 8 is a diagram showing another step of a method for manufacturing a multilayer ceramic electronic device according to a preferred embodiment of the present invention.

(5-3) As shown in FIG. 8, the resin 22 is injected between the semiconductor element 13 and the seat portion 11, so that the resin layer 16 is formed between the semiconductor element 13 and the seat portion 11 and, in addition, the resin 22 penetrates up to the lower surface side of the porous ceramic compact defining the seat portion 11.

The injection of the resin 22 is performed by supplying the resin 22 from a resin supply nozzle 24 to the resin introduction portion 11A of the seat portion 11. At this time, since the resin introduction portion 11A is located outside the vertically projected region R of the semiconductor element 13 mounted on the seat portion 11, the resin 22 is allowed to penetrate throughout the porous ceramic compact until it reaches the lower surface side and, in addition, the resin 22 is filled between the semiconductor element 13 and the seat portion 11, so that the resin layer 16 can be formed merely by supplying the resin 22 to the resin introduction portion 11A from above.

The resin 22 selectively penetrates and infiltrates into the porous seat portion 11 and between the semiconductor element 13 and the seat portion 11 through capillary effect. Therefore, the resin 22 does not substantially leak to the other regions after filling.

Subsequently, the resin 22 is heat-cured so as to adhere the seat portion 11 to the first principal surface 14 of the multilayer ceramic element assembly 4 with the resin 22. Regarding the resin used in this preferred embodiment, about 65 percent by weight of silica filler was included and the remainder was a mixture of an epoxy resin and a solvent, for example.

The amounts of the epoxy resin and the solvent may be changed in accordance with the thickness of the seat portion.

In this manner, the multilayer ceramic electronic device A is formed, wherein the semiconductor element 13 is mounted on the seat portion 11 such that the aggregate of the nonmetallic inorganic powder 21 is adhered to a portion of the first principal surface region 14 of the multilayer ceramic element assembly 4 with the resin 22.

In the multilayer ceramic electronic device A, the seat portion 11 is provided with the resin introduction portion 11A located outside the vertically projected region R of the semiconductor element 13 mounted on the seat portion 11. Therefore, the resin 22 penetrates until it reaches the lower surface side of the porous ceramic compact defining the seat portion 11, and, in addition, the resin layer 16 can be formed between the semiconductor element 13 and the seat portion 11 merely by supplying the resin 22 to the resin introduction portion 11A from above without requiring a complicated resin supply mechanism.

The seat portion 11 is preferably made of the aggregate of the ceramic powder, the silica filler, and the resin adhering these inorganic components to each other, and the resin layer 16 including the dispersed silica filler is formed between the seat portion 11 and the semiconductor element 13.

Therefore, the semiconductor element 13 is mechanically connected and fixed to the multilayer ceramic element assembly 4 (multilayer ceramic substrate 10) with the seat portion 11 therebetween by the resin layer 16. In addition, the semiconductor element 13 is mechanically and electrically connected to the multilayer ceramic element assembly 4 (multilayer ceramic substrate 10) reliably with the seat portion via hole conductors 17 and the solder 15 arranged therebetween. Consequently, the highly reliable multilayer ceramic electronic device A that has outstanding impact resistance, that is compatible for miniaturization, and that has outstanding dimensional accuracy can be obtained.

Furthermore, the seat portion 11 is provided with the resin introduction portion 11A located outside the vertically projected region R of the semiconductor element 13 mounted on the seat portion 11. Therefore, the resin 22 can penetrate until it reaches the lower surface side of the porous ceramic compact defining the seat portion 11, and, in addition, the resin layer 16 can be formed between the semiconductor element 13 and the seat portion 11 merely by supplying the resin 22 to the resin introduction portion 11A from above without a complicated resin supply mechanism. Consequently, the multilayer ceramic electronic device A in which the seat portion 11 is reliably adhered to the multilayer ceramic element assembly 4 and the semiconductor element 13 is securely bonded to and mounted on the seat portion 11 can be efficiently produced.

Characteristics Evaluation 1: Characteristics Evaluation with Respect to Leakage of Resin For the multilayer ceramic electronic device including the seat portion 11 provided with the resin introduction portion 11A as in the first preferred embodiment of the present invention, a state of leakage of the resin 22 (resin layer 16) filled in the seat portion 11 and between the seat portion 11 and the semiconductor element 13 was examined.

For the purposes of comparison, multilayer ceramic electronic devices of comparative examples were prepared as described below. For these multilayer ceramic electronic devices (Comparative Example 1 and Comparative Example 2), a state of leakage of the resin 22 (resin layer 16) filled in the seat portion 11 and between the seat portion 11 and the semiconductor element 13 was examined.

Figure 10:
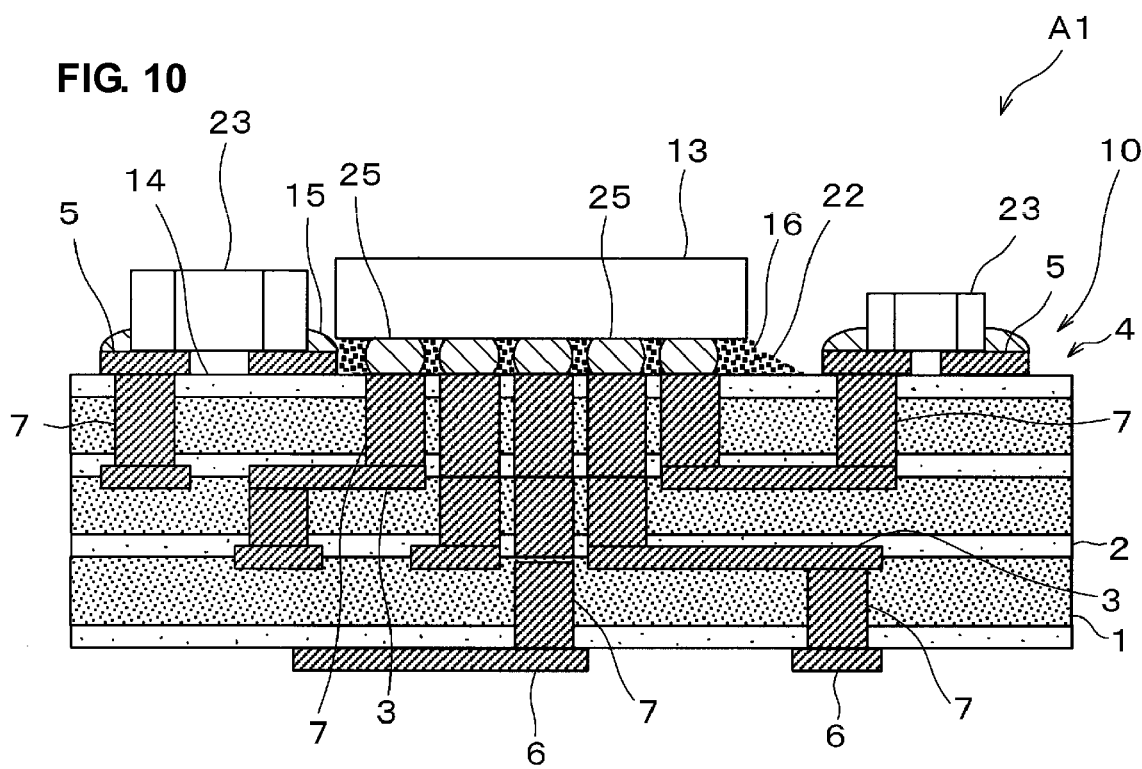
FIG. 10 is a diagram showing a multilayer ceramic electronic device according to Comparative example 1 for the purpose of comparing the characteristics of a multilayer ceramic electronic device according to a preferred embodiment of the present invention.

For Comparative Example 1, a multilayer ceramic electronic device A1 was prepared having a configuration, as shown in FIG. 10, in which solder balls 25 disposed on the semiconductor element 13 were melt-bonded to the surface of via hole conductors 7 exposed at the multilayer ceramic element assembly 4, the resin layer 16 defining an impact relaxation layer and a bonding layer was formed by filling the thermosetting resin 22 (substantially the same resin as the resin 22 used in the multilayer ceramic electronic device A) between the multilayer ceramic element assembly 4 and the semiconductor element 13 in order to improve the impact resistance, and the seat portion included in the multilayer ceramic electronic device A according to the first preferred embodiment of the present invention is not provided.

Figure 11:
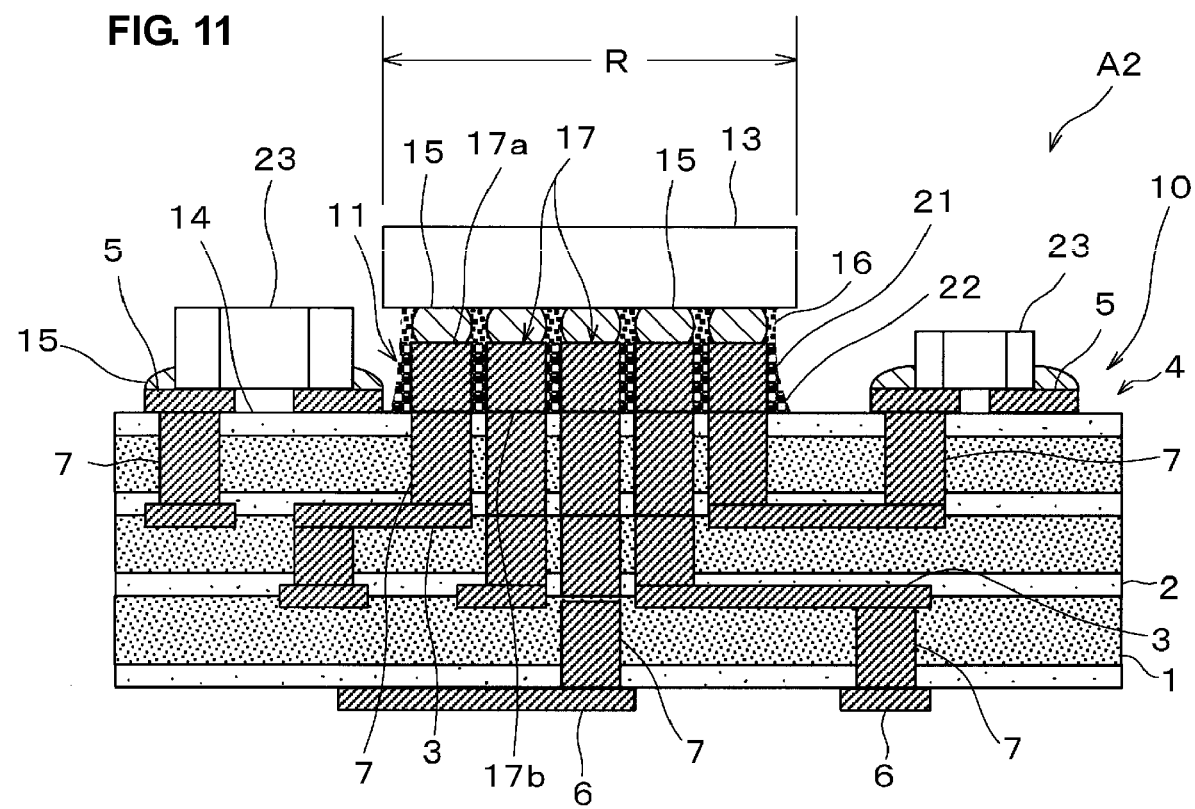
FIG. 11 is a diagram showing a multilayer ceramic electronic device according to Comparative example 2 for the purpose of comparing the characteristics of a multilayer ceramic electronic device according to a preferred embodiment of the present invention.

For Comparative Example 2, a multilayer ceramic electronic device A2 was prepared having a configuration, as shown in FIG. 11, in which a resin introduction portion was not provided, the seat portion 11 was provided while the entire seat portion 11 was located within the vertically projected region R of the semiconductor element 13 mounted thereon, the resin 22 was filled in the seat portion 11 and between the seat portion 11 and the semiconductor element 13, and the resin layer 16 defining an impact relaxation layer and a bonding layer was formed.

In each of the multilayer ceramic electronic devices A according to the first preferred embodiment of the present invention and multilayer ceramic electronic devices A1 and A2 of the Comparative Examples 1 and 2, the mounting height of the semiconductor element 13 (solder height of the lower portion of the semiconductor element 13 after mounting) was specified to be about 60 μm.

In the multilayer ceramic electronic device A according to the first preferred embodiment of the present invention and the multilayer ceramic electronic device A2 of the Comparative Example 2, the perimeter edge portion of the seat portion 11 located within the vertically projected region R of the semiconductor element 13 was located about 100 μm inside the perimeter edge portion of the semiconductor element 13.

In the multilayer ceramic electronic device A according to the first preferred embodiment of the present invention, the protrusion distance X (refer to FIG. 2A) of the resin introduction portion 11A, which was located outside the vertically projected region R of the semiconductor element 13, of the seat portion 11 from the side on which the resin introduction portion 11A was formed, was set at about 1 mm.

Injection of the resin was performed using a resin supply nozzle having a diameter of about 0.5 mm, and the resin 22 was supplied from the upper surface of the resin introduction portion 11A of the seat portion 11.

In Comparative Example 1, the resin 22 was injected into the gap between the multilayer ceramic element assembly 4 and the semiconductor element 13 from the location at a distance of about 0.5 mm from the side surface of the semiconductor element 13, so as to form the resin layer 16 between the multilayer ceramic element assembly 4 and the semiconductor element 13.

In Comparative Example 2, the resin 22 was supplied to the side surface of the seat portion 11 from the location at a distance of about 0.5 mm from the side surface of the semiconductor element 13, so as to fill the seat portion 11 with the resin 22.

In each of the multilayer ceramic electronic devices A, A1, and A2, the leakage length of the resin 22 from the edge portion of the semiconductor element 13 was measured.

As a result, in the multilayer ceramic electronic device A1, about 400 μm of leakage length of the resin 22 was measured, and in the multilayer ceramic electronic device A2, about 500 μm of leakage length was measured. Variations in leakage states thereof were significant, and it was determined that large design margins were required although statistical predictions were possible.

On the other hand, in the multilayer ceramic electronic device A, it was determined that there was substantially no leakage of the resin 22 from any location of the seat portion 11 and on three sides of the seat portion 11 at which the resin introduction portion 11A was not disposed, the resin 22 was retained inside the vertically projected region R of the semiconductor element 13.

Furthermore, it was determined that although the resin introduction portion 11A itself extended outside the vertically projected region R of the semiconductor element 13, the resin did not leak outside of the resin introduction portion 11A, and only consideration of the design margin of the resin introduction portion 11A was required. Therefore, the application region of the resin was easily predicted.

As described above, the injection resin included about 65 percent by weight of silica filler and the remainder was an organic mixture of an epoxy resin, a solvent, and other suitable components. However, when a resin including 30 percent by weight of silica filler and the remainder including an organic mixture of an acrylic resin, a solvent, and other suitable components was used, no leakage of the resin was observed.

In preferred embodiments of the present invention, the type and the composition of the resin is not specifically limited, and other types of resins and fillers can be used. The blend ratio thereof can be determined based on the production condition and other factors.

Characteristics Evaluation 2: Evaluation of Impact Resistance

Figure 12:
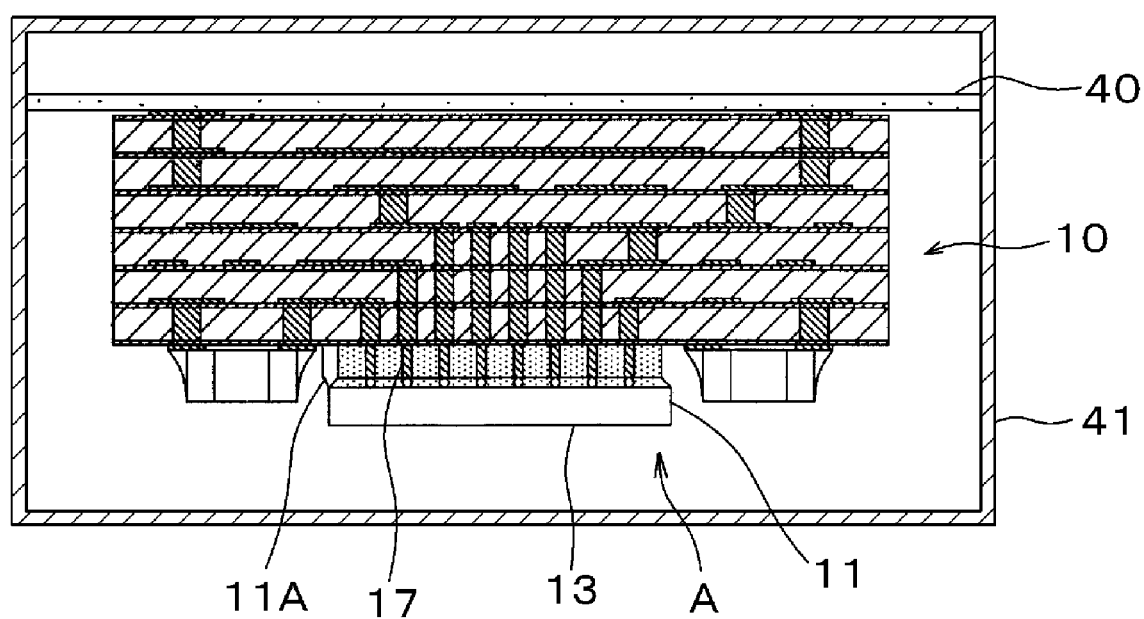
FIG. 12 is a diagram schematically showing a sample prepared for the purpose of examining the impact resistance of a multilayer ceramic electronic device produced by a method for manufacturing a multilayer ceramic electronic device according to an example of the preferred embodiments of the present invention.

As shown in FIG. 12, the multilayer ceramic electronic device A produced as described above was mounted on a printed circuit board 40 having a thickness of about 1.0 mm through reflow soldering. Thereafter, the multilayer ceramic electronic device A mounted on the printed circuit board 40 was disposed in a substantially rectangular parallelepiped case 41 such that the multilayer ceramic electronic device A was located on the lower surface side. Accordingly, a sample having a configuration in which the multilayer ceramic electronic device A was disposed in the resin casing 41 was prepared.

The sample was adjusted such that a total weight of the multilayer ceramic electronic device A, the printed circuit board 40, and the resin casing 41 was about 100 g.

The diameter of the seat portion via hole conductor 17 defining the multilayer ceramic substrate 10 was set to about 100 μm.

The resulting sample was held at a predetermined height, and was dropped 10 times while the lower surface of the resin casing 41 in a substantially horizontal arrangement collided with a concrete block having an upper surface thereof that extends substantially in a horizontal direction. Thereafter, the state of breakage of the connection portion of the semiconductor element 13 and the multilayer ceramic substrate 10 was examined.

The drop height was increased stepwise by about 0.10 m from about 0.50 m, and the impact resistance was evaluated, where the drop height at which breakage occurred was denoted as a height of breakage occurrence. The results thereof are shown in Table 1.

TABLE 1

| Sample No. | Height of breakage occurrence (m) | Solder height of lower side of seat portion (μm) | Leakage of resin | Impact resistance |
|---|---|---|---|---|
| 1 (Example) | 1.50 | 60 | no leakage | good |
| 2 | 0.8 | 60 | leakage | poor |

TABLE 1-continued

| Sample No. | Height of breakage occurrence (m) | Solder height of lower side of seat portion (μm) | Leakage of resin | Impact resistance |
|---|---|---|---|---|
| (Comparative Example 1) 3 (Comparative Example 2) | 1.50 | 60 | no leakage | good |

For the purposes of comparison, Comparative Examples were prepared by mounting the above-described multilayer ceramic electronic devices A1 and A2 of Comparative examples 1 and 2 shown in FIG. 10 and FIG. 11 on printed circuit boards, followed by disposing them in resin casings, and the impact resistance was evaluated as in the above-described first preferred embodiment of the present invention.

As a result, it was determined that breakage in the multilayer ceramic electronic device A according to the first preferred embodiment of the present invention did not occur until the drop height reached about 1.5 m, and, therefore, outstanding impact resistance was ensured.

Regarding Comparative Example 2, the impact resistance is ensured, but as described above, leakage of the resin is observed. Therefore, in order to meet high-density mounting requirements, it is necessary to use complicated filling equipment to fill the resin or to design a specific filling method.

On the other hand, regarding Comparative Example 1 which does not include the seat portion 11, it was determined that breakage occurred when the drop height reached about 0.8 m and, therefore, the impact resistance was unsatisfactory.

In the first preferred embodiment of the present invention, the multilayer ceramic electronic device A in which the resin introduction portion 11A was formed on only one side of the seat portion 11 has been described as an example. However, as shown in FIG. 13A, another preferred embodiment of the present invention includes resin introduction portions 11A provided on a plurality of sides of the seat portion 11. Furthermore, as shown in FIG. 13B, another preferred embodiment of the present invention includes a plurality of resin introduction portions 11A provided on one side. Alternatively, the resin introduction portion may be disposed at one or more corner portions.

Where no problem is caused by the extension of the seat portion to the surroundings of the vertically projected region R of the surface mount electronic device, e.g., the semiconductor element, as shown in FIG. 14, the two-dimensional area of the seat portion 11 may preferably be increased, the perimeter portion of the seat portion 11 may preferably extend outside the vertically projected region R of the surface mount electronic device 13, and the extended portion of the seat portion 11 may preferably define the resin introduction portion 11A. With this arrangement, substantially the same advantages that are obtained by the first preferred embodiment of the present invention are obtained.

In preferred embodiments of the present invention, the shape and the configuration of the resin introduction portion of the seat portion are not specifically limited, and various shapes and arrangements can be used within the bounds of not impairing the operation of preferred embodiments of the present invention.

In the first preferred embodiment of the present invention, the two-dimensional shape of the seat portion 11 except the resin introduction portion 11A is substantially rectangular. However, the shape of the seat portion 11 is not limited to being substantially rectangular and other shapes, such as substantially triangular, substantially polygonal (having five or more sides), substantially circular, or other various shapes may be used.

Furthermore, in the first preferred embodiment of the present invention, one semiconductor element is mounted on one seat portion. However, a plurality of semiconductor elements may preferably be disposed on one seat portion.

Figure 15A:
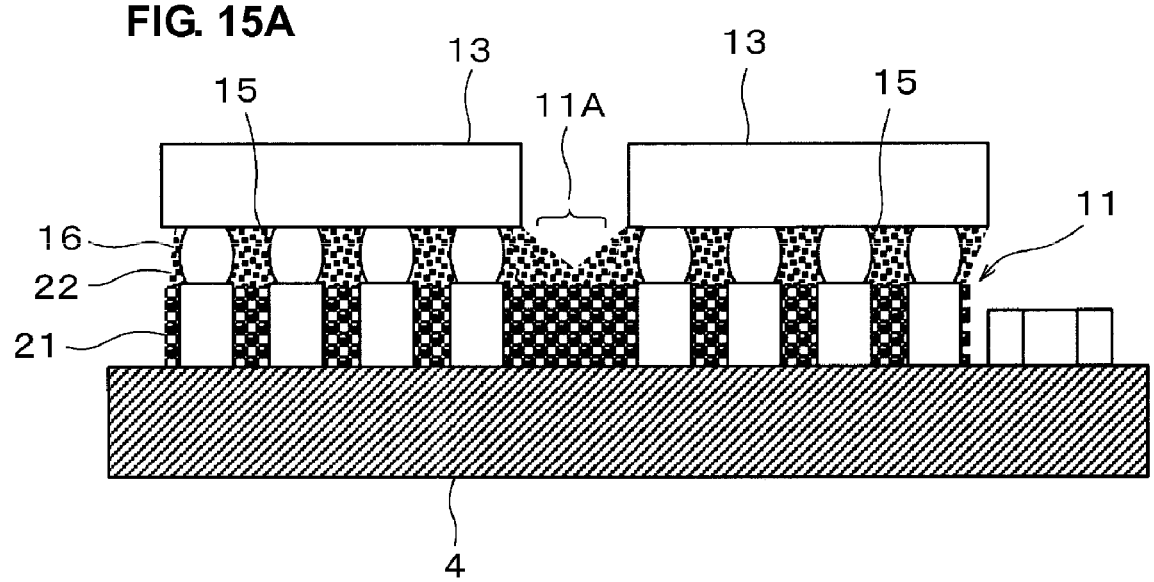
FIGS. 15A and 15B are diagrams showing a modified example of an arrangement of a surface mount electronic device on a seat portion in a multilayer ceramic electronic device according to preferred embodiments of the present invention.
Figure 15B:
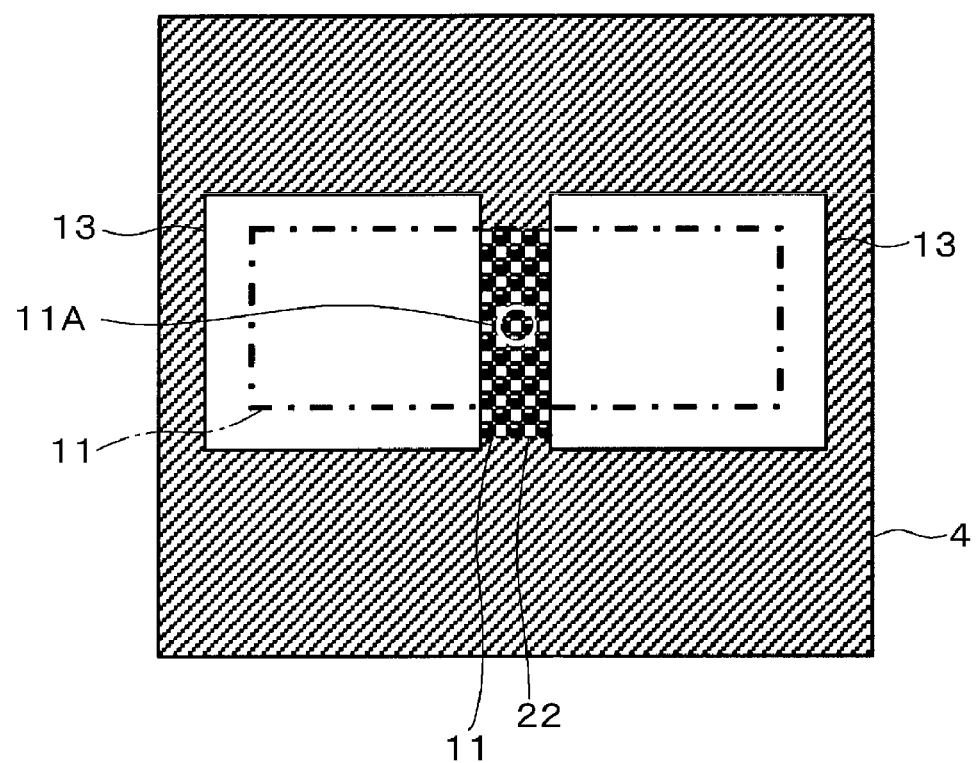

FIGS. 15A and 15B are diagrams showing an arrangement in which two semiconductor elements (surface mount electronic devices) 13 are disposed on one seat portion 11. In this preferred embodiment, a portion of the seat portion 11 is exposed between the two semiconductor elements 13, the portion defines the resin introduction portion 11A, the resin 22 is supplied to this one resin introduction portion 11A and, thereby, the resin 22 is filled into the seat portion 11 and the gaps between the seat portion 11 and the two semiconductor elements 13.

Figure 16:
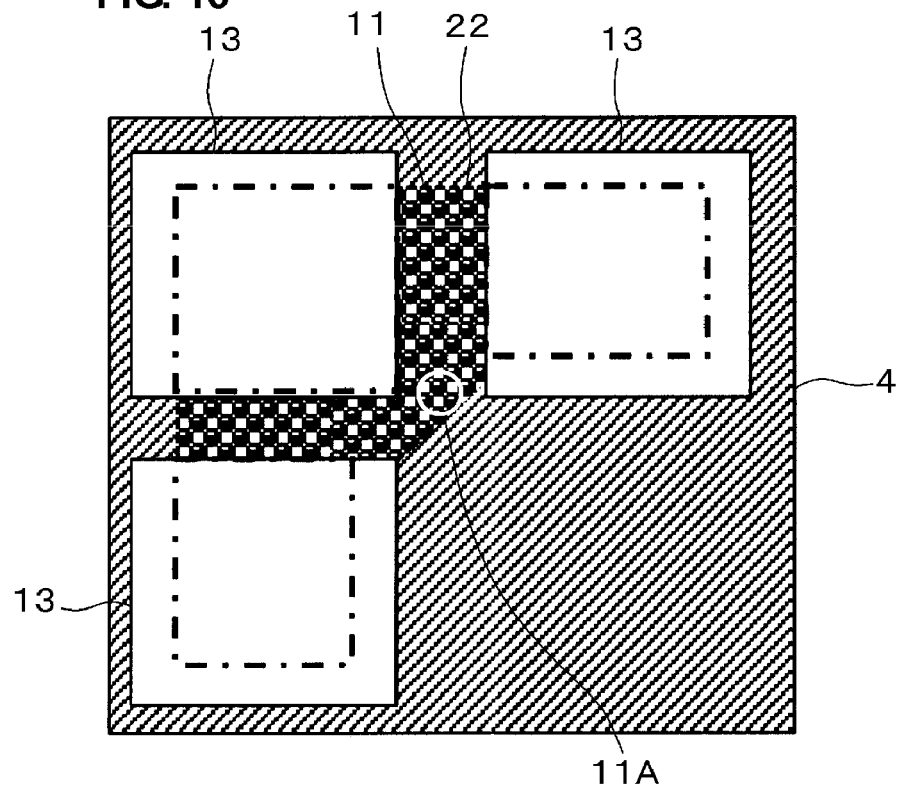
FIG. 16 is a diagram showing another modified example of an arrangement of a surface mount electronic device on a seat portion in a multilayer ceramic electronic device according to preferred embodiments of the present invention.
Figure 17:
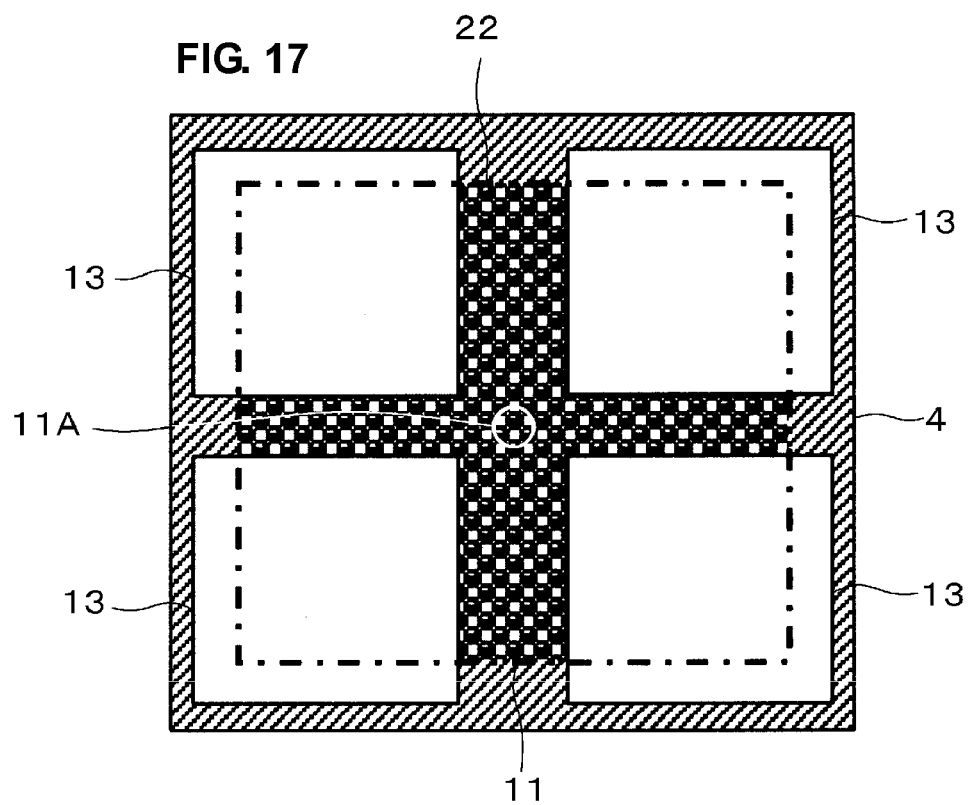
FIG. 17 is a diagram showing another modified example of an arrangement of a surface mount electronic device on a seat portion in a multilayer ceramic electronic device according to preferred embodiments of the present invention.
Figure 18:
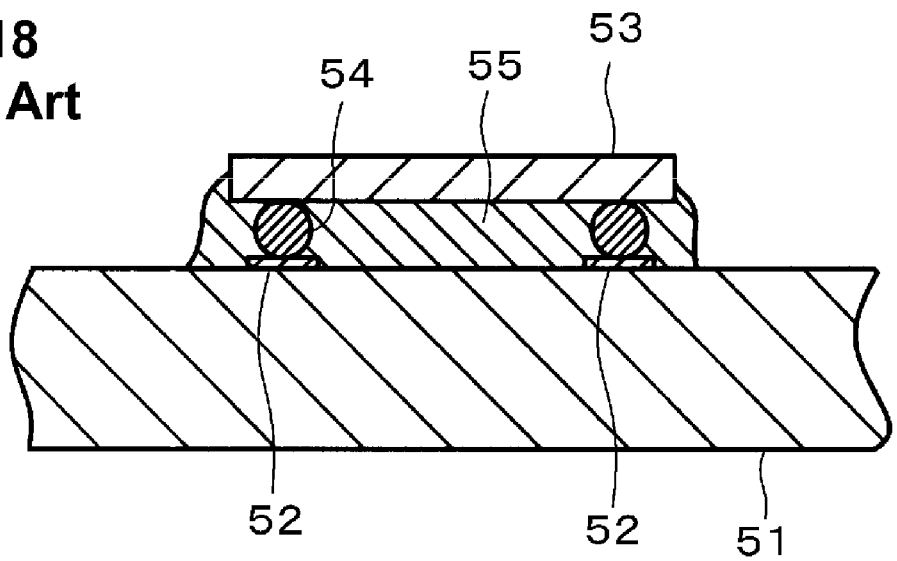
FIG. 18 is a diagram showing a method for mounting a semiconductor device according to the related art.
Figure 19:
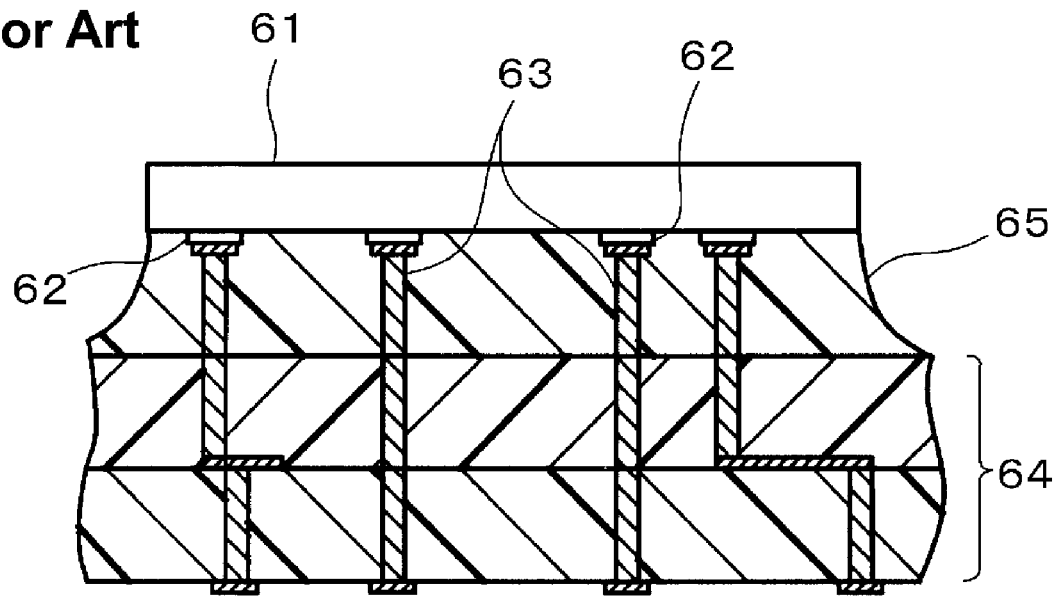
FIG. 19 is a diagram showing the mounting structure of another semiconductor element according to the related art.

FIG. 16 shows a configuration in which three semiconductor elements (surface mount electronic devices) 13 are mounted on one seat portion 11. FIG. 17 shows a configuration in which four semiconductor elements (surface mount electronic devices) 13 are mounted on one seat portion 11. In the configurations shown in FIG. 16 and FIG. 17, a predetermined region of the seat portion 11 defines the resin introduction portion 11A, the resin is supplied therefrom and, thereby, the resin 22 can be filled into the seat portion 11 and the gaps between the seat portion 11 and the plurality of semiconductor elements 13. However, it is possible to use a configuration in which a plurality of resin introduction portions are provided.

In the first preferred embodiment of the present invention, the method in which the seat portion via hole conductors 17 and the semiconductor element 13 are electrically connected using a solder paste has been described. However, it is also possible to use a configuration in which solder balls are provided instead of the solder paste on the semiconductor element 13 in advance, and the seat portion via hole conductors 17 and the semiconductor element 13 are bonded by melting the solder balls.

The present invention is not limited to the above-described first preferred embodiment of the present invention. The types of the non-metallic inorganic powder defining the seat portion and the resin, the arrangement, the dimensions, and the types of the materials used for the via hole conductors disposed in the seat portion, the constituent materials and the compositions of the ceramic base material layer and the shrinkage restriction layer, the types of the surface mount electronic device mounted on the seat portion, and other features of the present invention are not particularly limited, and various applications and modifications can be made within the scope of the present invention.

According to preferred embodiments of the present invention, a seat portion, on which a surface mount electronic device, e.g., a semiconductor element, is mounted, is adhered to a multilayer ceramic element assembly reliably, and a highly reliable multilayer ceramic electronic device that has outstanding impact resistance, that can be miniaturized, and that has outstanding dimensional accuracy can be efficiently produced.

Therefore, preferred embodiments of the present invention can be widely applied to multilayer ceramic electronic devices in which semiconductor elements and other surface mount electronic devices are mounted on multilayer ceramic substrates and a field of production thereof.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing a multilayer ceramic electronic device in which a surface mount electronic device is mounted on a first principal surface of a multilayer ceramic element assembly, the method comprising the steps of:
    (a) preparing the multilayer ceramic element assembly including a plurality of laminated unsintered ceramic base material layers, a first conductor pattern, and a seat portion disposed in at least a portion of the first principal surface of the multilayer ceramic element assembly and arranged to mount the surface mount electronic device thereon, the seat portion including a non-metallic inorganic powder as a primary component, a second conductor pattern connected to the surface mount electronic device, and a resin introduction portion located outside a vertically projected region of the surface mount electronic device and arranged to introduce a resin to the seat portion;
    (b) firing the multilayer ceramic element assembly;
    (c) mounting the surface mount electronic device on the seat portion of the fired multilayer ceramic element assembly with the second conductor pattern therebetween;
    (d) filling the resin from the resin introduction portion into the seat portion including the non-metallic inorganic powder as the primary component and between the seat portion and the surface mount electronic device; and
    (e) curing the resin.

2. The method for manufacturing a multilayer ceramic electronic device according to claim 1, wherein the seat portion including the non-metallic inorganic powder as the primary component is formed from a porous ceramic compact.

3. The method for manufacturing a multilayer ceramic electronic device according to claim 1, wherein the plurality of unsintered ceramic base material layers and a shrinkage restriction layer arranged to restrict shrinkage of the plurality of unsintered ceramic base material layers in a direction substantially perpendicular to a thickness direction of the plurality of unsintered ceramic base material layers are laminated on each other.

4. The method for manufacturing a multilayer ceramic electronic device according to claim 1, wherein the seat portion is provided with via hole conductors defining the second conductor pattern, one end surface of each via hole conductor is exposed at a surface of the seat portion, and the surface mount electronic device is mounted on the one end surface of each of the via hole conductors exposed at the surface with an electrically conductive joining member therebetween.

5. The method for manufacturing a multilayer ceramic electronic device according to claim 1, wherein the second conductor pattern of the seat portion connects the surface mount electronic device mounted on the seat portion and the first conductor pattern of the multilayer ceramic element assembly.

6. The method for manufacturing a multilayer ceramic electronic device according to claim 1, wherein the surface mount electronic device is a semiconductor element.

7. The method for manufacturing a multilayer ceramic electronic device according to claim 1, wherein a plurality of surface mount electronic devices are mounted on the seat portion, the resin introduction portion is common to the plurality of surface mount electronic devices, and the resin is filled from the common resin introduction portion so as to fill the resin into the seat portion and between the seat portion and the plurality of surface mount electronic devices.

8. The method for manufacturing a multilayer ceramic electronic device according to claim 1, wherein additional surface mount electronic devices other than the surface mount electronic device mounted on the seat portion are mounted on regions of the first principal surface of the multilayer ceramic element assembly in which the seat portion is not disposed.

9. The method for manufacturing a multilayer ceramic electronic device according to claim 3, wherein the shrinkage restriction layer is disposed on the first principal surface side of the multilayer ceramic element assembly.

10. The method for manufacturing a multilayer ceramic electronic device according to claim 1, wherein a region other than the resin introduction portion in the seat portion is located inside the vertically projected region of the surface mount electronic device mounted on the seat portion.

11. The method for manufacturing a multilayer ceramic electronic device according to claim 1, wherein a thickness of the seat portion is about 15 μm to about 150 μm.

12. The method for manufacturing a multilayer ceramic electronic device according to claim 3, wherein the unsintered ceramic base material layer is an unsintered ceramic base material layer including low-temperature-sinterable ceramic as a primary component and the shrinkage restriction layer is a shrinkage restriction layer including hard-to-sinter ceramic, which is not substantially sintered at a sintering temperature of the low-temperature-sinterable ceramic, as a primary component.

13. The method for manufacturing a multilayer ceramic electronic device according to claim 1, wherein the non-metallic inorganic powder defining the seat portion is a ceramic powder which is not substantially sintered at a sintering temperature of the ceramic defining the unsintered ceramic base material layer.

* * * * *